United States Patent
Lin et al.

(10) Patent No.: US 12,525,478 B2
(45) Date of Patent: Jan. 13, 2026

(54) SYSTEM AND METHOD OF PROVIDING FOUP OR CASSETTE SUPPORTING STRUCTURE FOR HANDLING VARIOUS SIZE OR SHAPE WAFERS AND PANELS

(71) Applicant: STATS ChipPAC Pte. Ltd., Singapore (SG)

(72) Inventors: Yaojian Lin, Jiangyin (CN); DanFeng Yang, Jiangyin (CN); SongHua Xu, Jiangyin (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 165 days.

(21) Appl. No.: 18/193,820

(22) Filed: Mar. 31, 2023

(65) Prior Publication Data
US 2024/0332051 A1     Oct. 3, 2024

(51) Int. Cl.
    *H01L 21/673*     (2006.01)
    *H01L 21/67*     (2006.01)

(52) U.S. Cl.
    CPC .. *H01L 21/67383* (2013.01); *H01L 21/67294* (2013.01)

(58) Field of Classification Search
None
See application file for complete search history.

(56) References Cited

U.S. PATENT DOCUMENTS

| | | | | |
|---|---|---|---|---|
| 5,472,099 A | * | 12/1995 | Terashima | H01L 21/6732 |
| | | | | 211/41.18 |
| 6,092,981 A | * | 7/2000 | Pfeiffer | H01L 21/67313 |
| | | | | 211/41.18 |
| 6,817,821 B2 | * | 11/2004 | Henderson | B23K 1/0016 |
| | | | | 414/211 |
| 7,121,414 B2 | * | 10/2006 | Beckhart | H01L 21/6732 |
| | | | | 211/41.18 |
| 7,337,911 B2 | * | 3/2008 | Wu | H01L 21/67396 |
| | | | | 211/26 |

(Continued)

FOREIGN PATENT DOCUMENTS

| | | | | | |
|---|---|---|---|---|---|
| JP | 2000007148 A | * | 1/2000 | | B65G 49/062 |
| JP | 2000332097 A | * | 11/2000 | | H01L 21/67766 |
| KR | 20020027974 A | * | 4/2002 | | |

(Continued)

*Primary Examiner* — Mollie Impink
(74) *Attorney, Agent, or Firm* — Robert D. Atkins; PATENT LAW GROUP: Atkins and Associates, P.C.

(57) ABSTRACT

A front opening unified pod has a housing and a plurality of horizontal support members disposed within the housing and adapted to accommodate a plurality of semiconductor wafers or panels. The plurality of semiconductor wafers or panels have a different size or shape, such as circular and rectangular. A first one of the plurality of horizontal support members has a wing to support the plurality of different size or shape semiconductor wafers or panels. The plurality of horizontal support members has a first side horizontal support member, a second side horizontal support member, and a center horizontal support member disposed between the first side horizontal support member and the second side horizontal support member. The plurality of horizontal support members is insertable into the housing. One or more of the plurality of horizontal support members has an opening for laser identification.

26 Claims, 20 Drawing Sheets

(56) References Cited

U.S. PATENT DOCUMENTS 11,161,648 B2 * 11/2021 Nakayama .......... H01L 21/6734
2003/0075518 A1 4/2003 Tsai et al.

FOREIGN PATENT DOCUMENTS

| KR | 20090110625 A | * | 10/2009 | ....... H01L 21/67309 |
| KR | 102446066 B1 | * | 9/2022 | ....... H01L 21/67363 |
| TW | 1586597 B | * | 6/2017 | ....... H01L 21/67379 |
| WO | WO-2009107254 A1 | * | 9/2009 | ....... H01L 21/67383 |

* cited by examiner

SYSTEM AND METHOD OF PROVIDING FOUP OR CASSETTE SUPPORTING STRUCTURE FOR HANDLING VARIOUS SIZE OR SHAPE WAFERS AND PANELS

FIELD OF THE INVENTION

The present invention relates in general to semiconductor manufacturing devices and, more particularly, to a system and method of providing a front opening unified pod (FOUP) or cassette supporting structure for handling various size or shape wafers and panels in semiconductor manufacturing.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor manufacturing equipment, such as a FOUP or cassette supporting structure, are used to handle and support wafers and panels during the manufacturing process. The FOUP is typically fixed in size to accommodate one type of wafer or panel, i.e., one size and one shape. Yet there are many different types of wafers and panels. Some wafers are circular, while panels are typically rectangular or square. And there are many different sizes, e.g., ranging from 200-600 millimeters (mm) in diameter or length. The additional equipment needed to handle all the different types of wafers and panels leads to higher manufacturing cost, e.g., with wafer level fan-out packages (WLFOP or WLP). In addition, the low yield on typical panel level fan-out package (PLFOP or PLP) limits package size and redistribution layer (RDL) line and space (L/S). There is a lack of manufacturing flexibility to fit market demand in both legacy 200-300 mm WL and PLP process.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
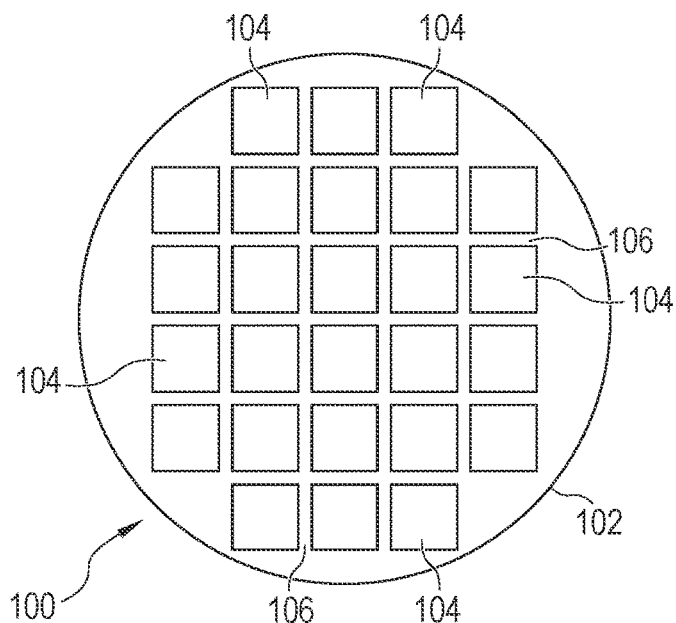
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 300-600 mm.

Figure 1B:
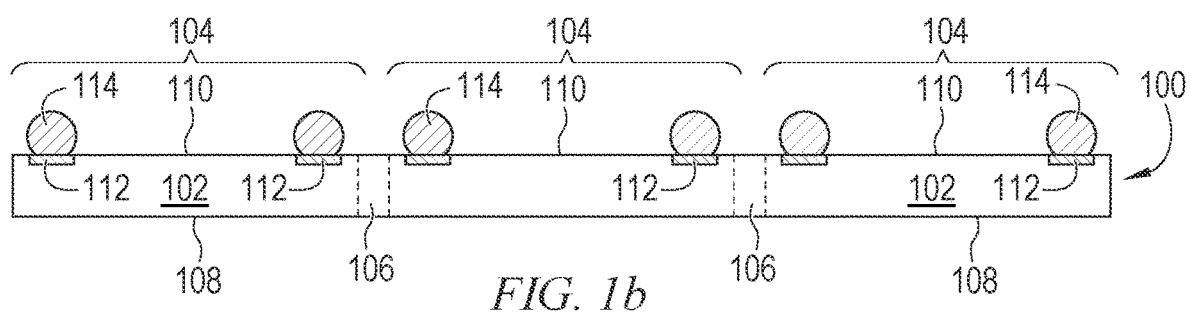

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using physical vapor deposition (PVD), chemical vapor deposition (CVD), electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
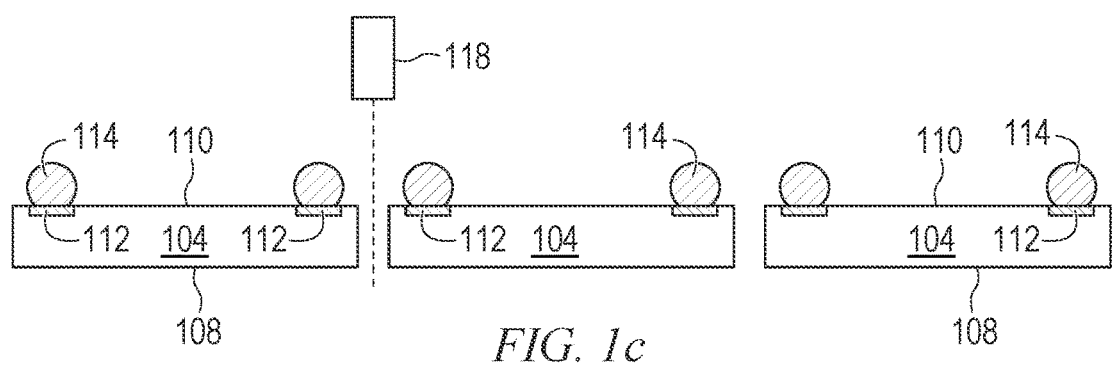

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or known good unit (KGD/KGU) post singulation.

Figure 2A:
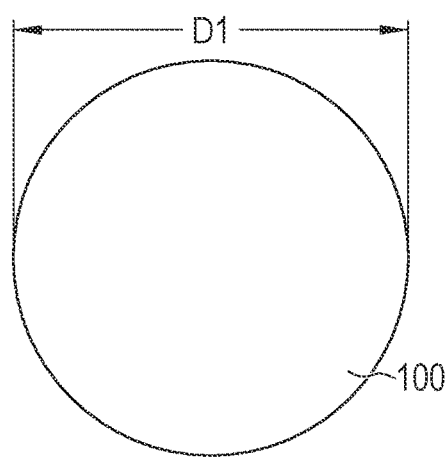
FIGS. 2a-2e illustrate various size and shape semiconductor wafers and panels.

The semiconductor wafer or panel can have a number of shapes and sizes. FIG. 2a shows circular semiconductor wafer 100, similar to FIG. 1a, with a diameter D1 and defaulted notch (not shown in the drawing) for orientation management like typical 300 mm, e.g., D1 ranges from 300-600 mm. In one embodiment, semiconductor wafer 100 has a diameter D1=300 mm. In another embodiment, semiconductor wafer 100 has a diameter D1=400 mm. In another embodiment, semiconductor wafer 100 has a diameter D1=450 mm. In another embodiment, semiconductor wafer 100 has a diameter D1=510 mm. A 300 mm wafer 100 can be useful for Si interposer with through silicon via (TSV), middle end of line (MEOL), RDL, micro bump, and sub-5 μm fan-out with high yield, while providing a fine line for fine-coast flexible lines to integrate with 450 mm wafers and 320×320 mm panels to achieve balanced material, performance, reliability, and cost integration. A 450 mm wafer 100 can be useful for less than 15 μm L/S with sub-5 μm fan-out and high yield in 32×26 mm reticle size—70×70 mm reticle size for fan-out RDL stack interposer multi-chip module (FO FSI MCM) and fan-out embedded die interposer multi-chip module (FO EDI MCM) with optional landside Si capacitor or IPD.

Figure 2B:
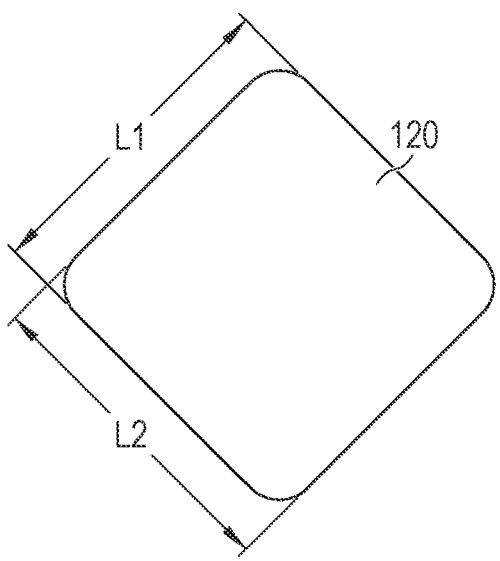

FIG. 2b shows a four-sided semiconductor panel 120, with four rounded corners and typical 300 mm notch type (not shown in the drawing) at the middle of one side, with or without containing semiconductor die, similar to FIG. 1a. Alternatively, semiconductor panel 120 could be temporary carrier for supporting RDL stack build-up, or embedded-die/component fan-out with RDL stack build up, or wafer-level/panel-level package C2W (chip to wafer) assembly process. Semiconductor panel 120 has dimensions L1 ranging from 200-600 mm and L2 ranging from 200-600 mm. In one embodiment, semiconductor panel 120 is L1=280 mm and L2=280 mm. In another embodiment, semiconductor panel 120 is L1=320 mm and L2=320 mm. In another embodiment, semiconductor panel 120 is L1=350 mm and L2=350 mm. In another embodiment, semiconductor panel 120 is L1=360 mm and L2=360 mm. In another embodiment, semiconductor panel 120 is L1=400 mm and L2=450 mm. In another embodiment, semiconductor panel 120 is L1=410 mm and L2=510 mm. In another embodiment, semiconductor panel 120 is L1=450 mm and L2=450 mm. In another embodiment, semiconductor panel 120 is L1=510 mm and L2=515 mm. A 320×320 mm panel 120 can be useful for greater than 10 μm L/S on a power package, hybrid embedded die in flipchip ball grid array (fcBGA) or fan-out chip scale package (foCSP).

Figure 2C:
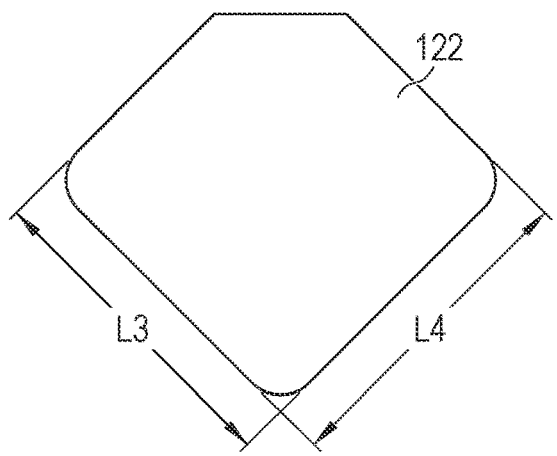

FIG. 2c shows a four-sided semiconductor panel 122, with three rounded corners and one chamfered corner at 30-60 degrees, with or without containing semiconductor die, similar to FIG. 1a. Alternatively, semiconductor panel 122 could be temporary carrier for supporting RDL stack build-up, or embedded-die/component fan-out with RDL stack build up, or wafer-level/panel-level package C2W assembly process. Semiconductor panel 122 has dimensions L3 ranging from 200-600 mm and L4 ranging from 200-600 mm. In one embodiment, semiconductor panel 122 is L3=280 mm and L4=280 mm. In another embodiment, semiconductor panel 122 is L3=320 mm and L4=320 mm. In another embodiment, semiconductor panel 122 is L3=400 mm and L4=450 mm. In another embodiment, semiconductor panel 122 is L3=510 mm and L4=515 mm.

Figure 2D:
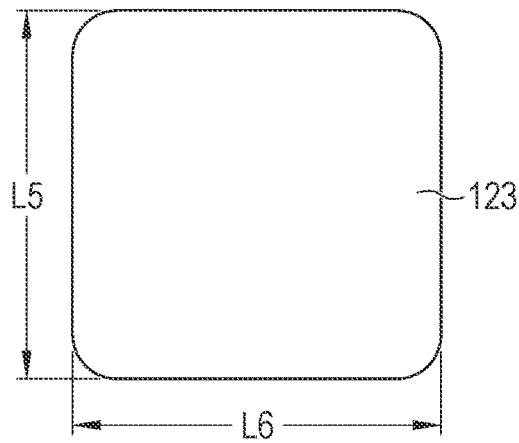

FIG. 2d shows a four-sided semiconductor panel 123, with four rounded corners and typical 300 mm wafer notch type (not shown in the drawing) at the middle of one side, with or without containing semiconductor die, similar to FIG. 1a. Alternatively, semiconductor panel 123 could be temporary carrier for supporting RDL stack build-up, or embedded-die/component fan-out with RDL stack build up, or wafer-level/panel-level package C2W assembly process. Semiconductor panel 123 has dimensions L5 ranging from 200-600 mm and L6 ranging from 200-600 mm. In one embodiment, semiconductor panel 123 is L5=280 mm and L6=280 mm. In another embodiment, semiconductor panel 123 is L5=320 mm and L6=320 mm. In another embodiment, semiconductor panel 123 is L5=350 mm and L6=350 mm. In another embodiment, semiconductor panel 123 is L5=360 mm and L6=360 mm. In another embodiment, semiconductor panel 123 is L5=400 mm and L6=450 mm. In another embodiment, semiconductor panel 123 is L5=410 mm and L6=510 mm. In another embodiment, semiconductor panel 123 is L5=450 mm and L6=450 mm. In another embodiment, semiconductor panel 123 is L5=510 mm and L6=515 mm.

Figure 2E:
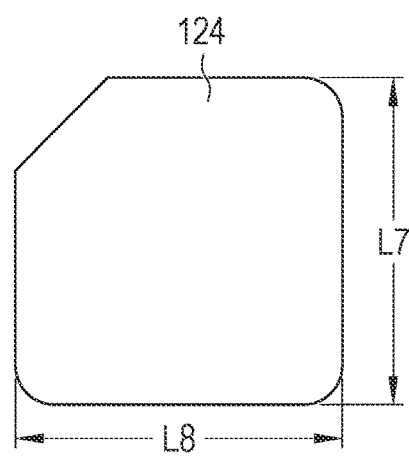

FIG. 2e shows a four-sided semiconductor panel 124, with three rounded corners and one chamfered corner at 30-60 degrees, with or without containing semiconductor die, similar to FIG. 1a. Alternatively, semiconductor panel 124 could be temporary carrier for supporting RDL stack build-up, or embedded-die/component fan-out with RDL stack build up, or wafer-level/panel-level package C2W assembly process. Semiconductor panel 124 has dimensions L7 ranging from 200-600 mm and L8 ranging from 200-600 mm. In one embodiment, semiconductor panel 124 is L7=280 mm and L8=280 mm. In another embodiment, semiconductor panel 124 is L7=320 mm and L8=320 mm. In another embodiment, semiconductor panel 124 is L7=350 mm and L8=350 mm. In another embodiment, semiconductor panel 124 is L7=360 mm and L8=360 mm. In another embodiment, semiconductor panel 124 is L7=400 mm and L8=450 mm. In another embodiment, semiconductor panel 124 is L7=410 mm and L8=510 mm. In another embodiment, semiconductor panel 124 is L7=450 mm and L8=450 mm. In another embodiment, semiconductor panel 124 is L7=510 mm and L8=515 mm.

Figure 3A:
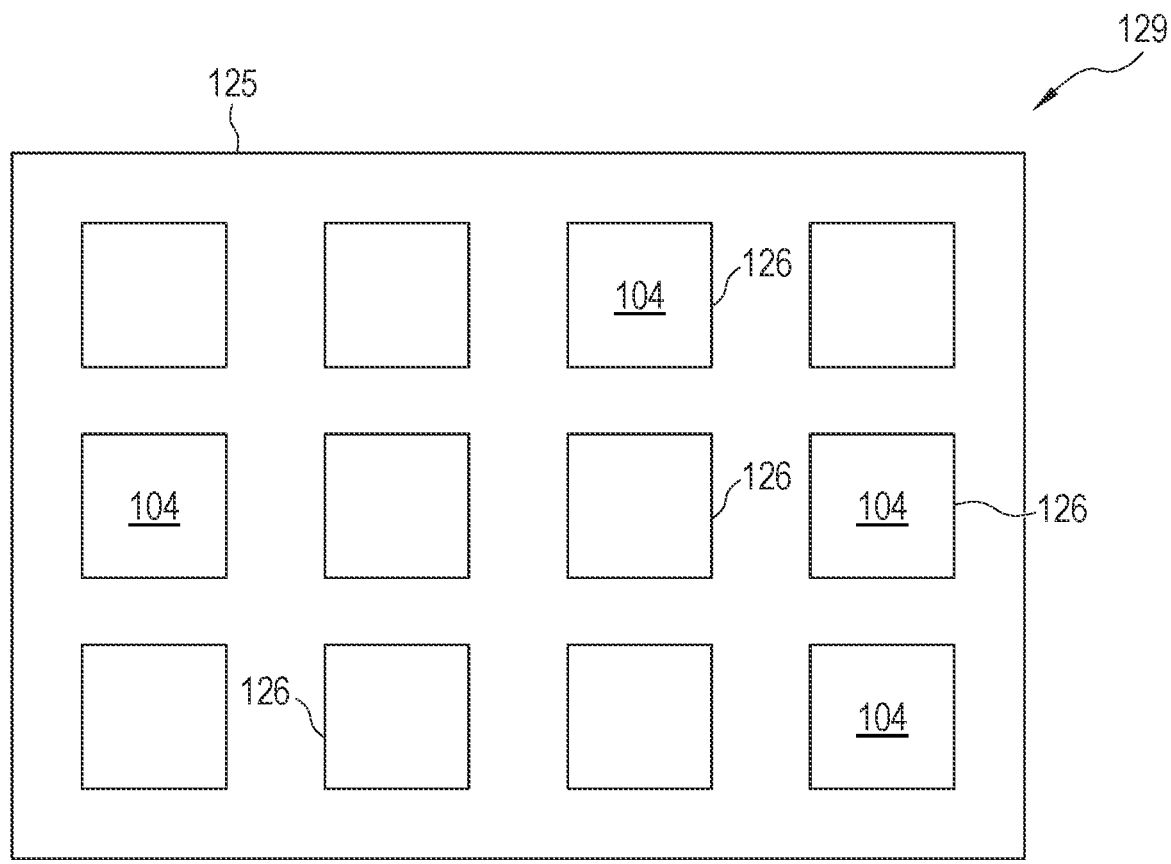
FIGS. 3a-3b illustrate a carrier containing one or more semiconductor die as a reconstituted wafer.
Figure 3B:
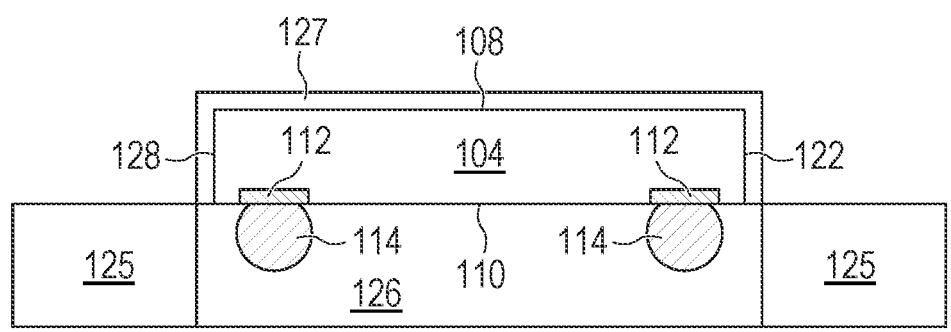

Semiconductor die 104 from FIGS. 1a-1c can be placed on a carrier or tray and encapsulated to protect its surfaces. FIG. 3a illustrates a tray or carrier 125 with openings or slots 126 capable of holding semiconductor die 104. Semiconductor die 104, using a pick and place operation, are placed in a flat position within a slot or opening 126 in tray 125 sized to fit the semiconductor die. The top, bottom, and sides of semiconductor die 104 are visible and accessible when disposed in tray 126 for cleaning, inspection, testing, and measurements. In FIG. 3b, encapsulant or molding compound 127 deposited over back surface 108 and side surfaces 128 of semiconductor die 104. Encapsulant 127 can be polymer composite material, such as epoxy resin with filler, epoxy acrylate with filler, or polymer with proper filler. Encapsulant 127 is non-conductive, provides structural support, and environmentally protects the semiconductor device from external elements and contaminants. Semiconductor die 104 disposed on the RDL stack or embedded die fan-out interposer over carrier 125 with temporary bonding layer on top of carrier 125 direct surface, and covered with encapsulant 127 is reconstituted wafer or panel 129, after being de-bonded from carrier 125. Reconstituted wafer or panel 129 can have the same or similar size and shape as wafer or panel 100, 120, 122, 123, or 124. The C4 bump or Cu pillar bump 114 is formed after debonding.

The semiconductor die or package unit from wafer or panel 100, 120, 122, 123, and 124, as well as reconstituted wafer or panel 129, must undergo a number of semiconductor manufacturing processes. One such process is the formation of RDL. The RDL can be formed over surface 108 or surface 110 and together with appropriate insulating layers provide for electrical interconnect for the die, as well as other electrical components within the package. A wafer or panel handling equipment or system, as described in FIGS. 4a-4c, is required to handle wafer or panel 100, 120, 122, 123, and 124, as well as reconstituted wafer or panel 129, during the various semiconductor manufacturing processes.

Figure 4A:
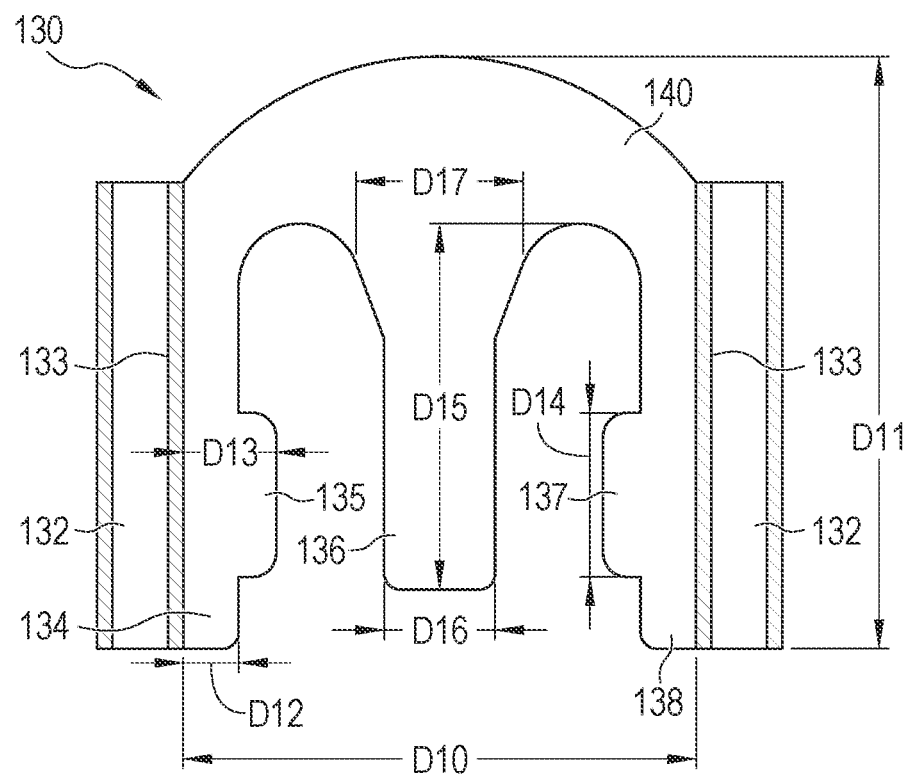
FIGS. 4a-4c illustrate a first embodiment of a FOUP capable of handling a variety of different size and shape semiconductor wafers and panels.
Figure 4B:
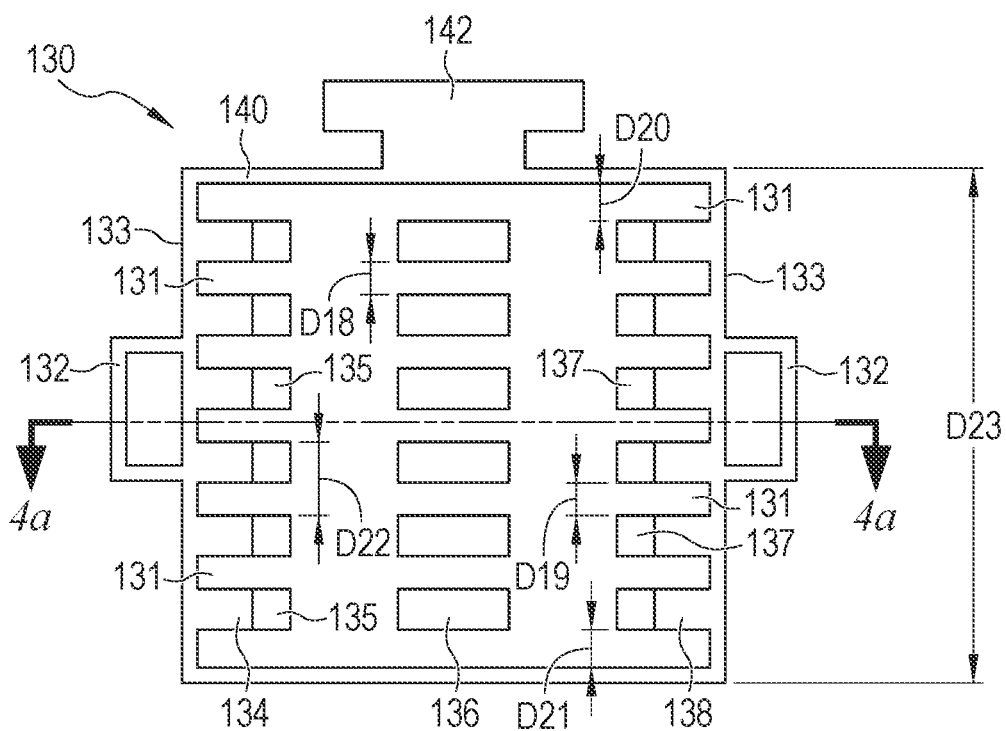
Figure 4C:
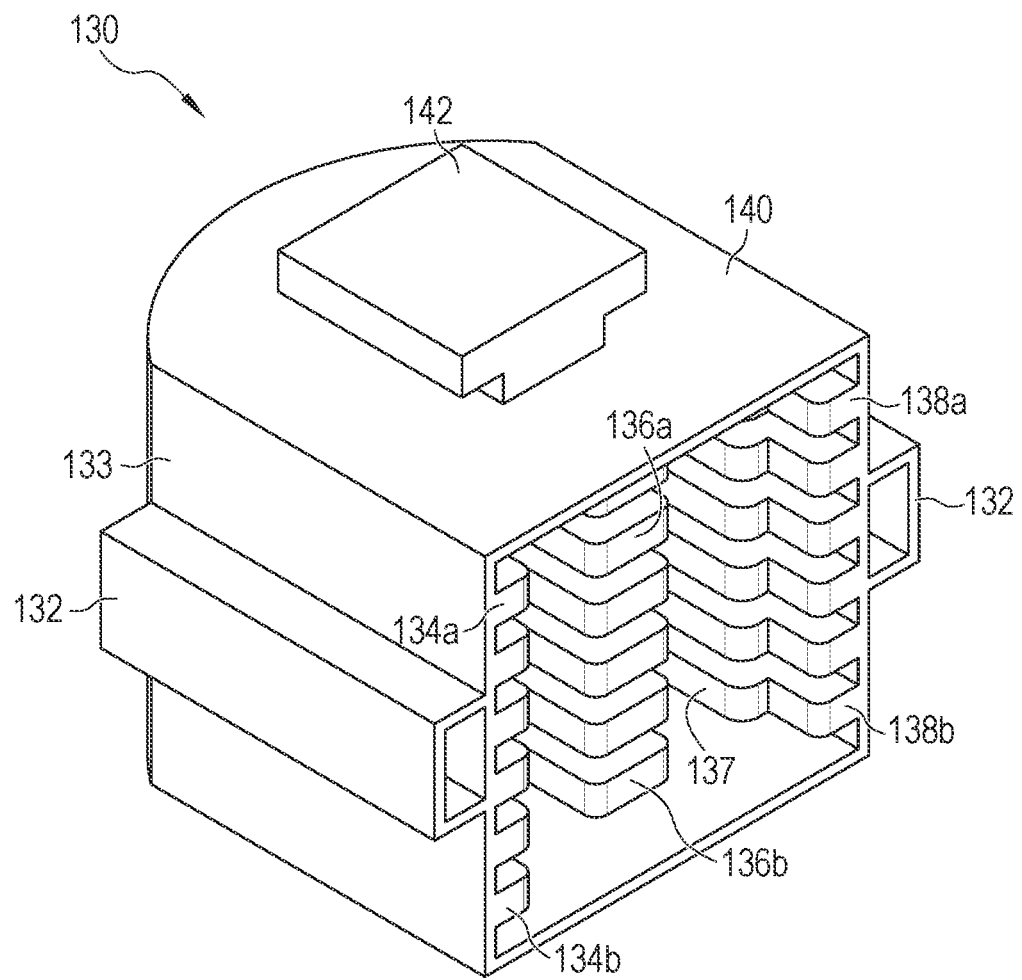

In FIG. 4a, FOUP or cassette supporting structure 130 (herein simply FOUP) is used to simultaneously handle a variety and mix of semiconductor wafers and/or panels 100, 120, 122, 123, and 124, as well as reconstituted wafer or panel 129, i.e., at least two types of shape and size, for various manufacturing operations. FIG. 4a is a top view of FOUP 130 and FIG. 4b is a front side view of the FOUP. FIG. 4c is a perspective view of FOUP 130. Collectively, FIGS. 4a-4c illustrate how FOUP 130 is capable to simultaneously accommodate and execute manufacturing processes on multiple combinations, i.e., at least two types of shape and size, of semiconductor wafers and/or panels 100, 120, 122, 123, and 124, as well as reconstituted wafer or panel 129, collectively referred to as wafers 250, see FIGS. 11-13. FOUP 130 is shown with six slots 131 to accommodate six wafers 250. In other embodiments, FOUP 130 can have any number of slots 131, preferably 4-8 slots.

Channels 132, either full or partial length of FOUP, are affixed to or molded with side surface 133 of housing 140. Horizontal support members 134, 136, and 138, also referred to as slot supports or tongues, extend from the back of housing 140 to the front of the housing in a parallel orientation. Wing 135 of side horizontal support member 134 and wing 137 of side horizontal support member 138 provide additional surface area to accommodate and support different sizes and shapes of wafers 250. In one embodiment, center support member 136 extends at least 60% of the housing length. In some embodiments, center horizontal support member 136 is shorter than side horizontal support members 134 and 138 to aid with loading and unloading of wafers 250. Handle 142 extending from housing 140 provides a secure way to carry, maneuver, or suspend FOUP 130.

FOUP 130 has a common set of dimensions to accommodate and support a variety of different size and shape of wafers 250, i.e., at least two types of shape and size. One FOUP 130 can accommodate and support multiple combinations of wafers 250, i.e., at least two kinds. In other words, one set of dimensions for FOUP 130 works for processing of a variety of size and shape of wafers 250, i.e., at least two kinds, at the same time. Table 1 shows exemplary dimensions for FOUP 130 in FIGS. 4a and 4b.

TABLE 1

Dimensions of FOUP

| Dimension | Range (mm) | Typical value (mm) |
|---|---|---|
| D10 | 400-550 | 450 to 510 |
| D11 | 400-550 | 450 to 510 |
| D12 | ≥5.0 | 15.0 |
| D13 | ≥10.0 | 20.0 |
| D14 | ≥10.0 | 20.0 |
| D15 | ≥225.0 | 350.0 |
| D16 | ≥20.0 | 50.0 |
| D17 | ≥70.0 | 100.0 |
| D18 | ≥8.0 | 10.0 |
| D19 | ≥8.0 | 12.0-15.0 |
| D20 | ≥8.0 | 12.0-15.0 |
| D21 | ≥1.0 | 2.0 |
| D22 | ≥10.0 | 15.0-20.0 |
| D23 | ≥150.0 | 250-350 |

FIG. 4c provides a perspective view to further understand the features and dimensions of FIGS. 4a and 4b. FOUP 130 is a molded unibody construction made with polymer, metal, polymer matrix composite, or other durable material with anti-ESD capability to house and support wafers 250. Horizontal support members 134a, 136a, and 138a accommodate a first wafer 250. Horizontal support members 134b, 136b, and 138b accommodate a second wafer 250, possibly the same size and shape as the wafer on horizontal support members 134a, 136a, and 138a, or possibly different from the wafer on horizontal support members 134a, 136a, and 138a. Wings 135 and 137 provide additional surface area to overlap and support a variety of different sizes and shapes of wafers 250 for various semiconductor manufacturing steps, at the same time. In one embodiment, wafers 250 can overlap wings 135 and 137 by greater than 2.0 mm, e.g., 10.0 mm.

In some cases, the dimensions of a first FOUP 130 may accommodate and support a first range of wafers 250, while the dimensions of a second FOUP 130 accommodates and supports a second range of wafers 250. In other words, there can be a larger FOUP 130 for a group of larger wafers 250, and a smaller FOUP 130 for a group of smaller wafers 250. For example, semiconductor wafers 350 mm and larger use the larger FOUP 130, while semiconductor wafers 300 mm and smaller use a FOUP with smaller dimensions.

Figure 5A:
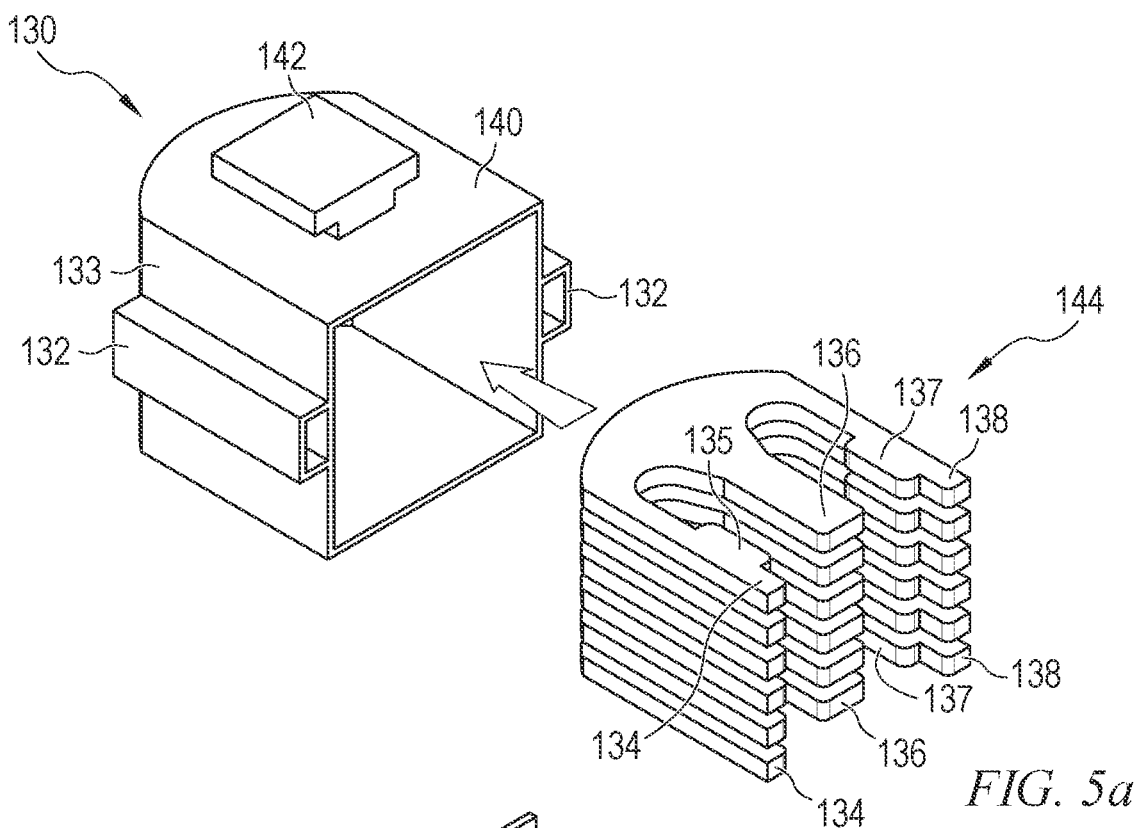
FIGS. 5a-5b illustrate a FOUP with insertable horizontal support members and optional door.
Figure 5B:
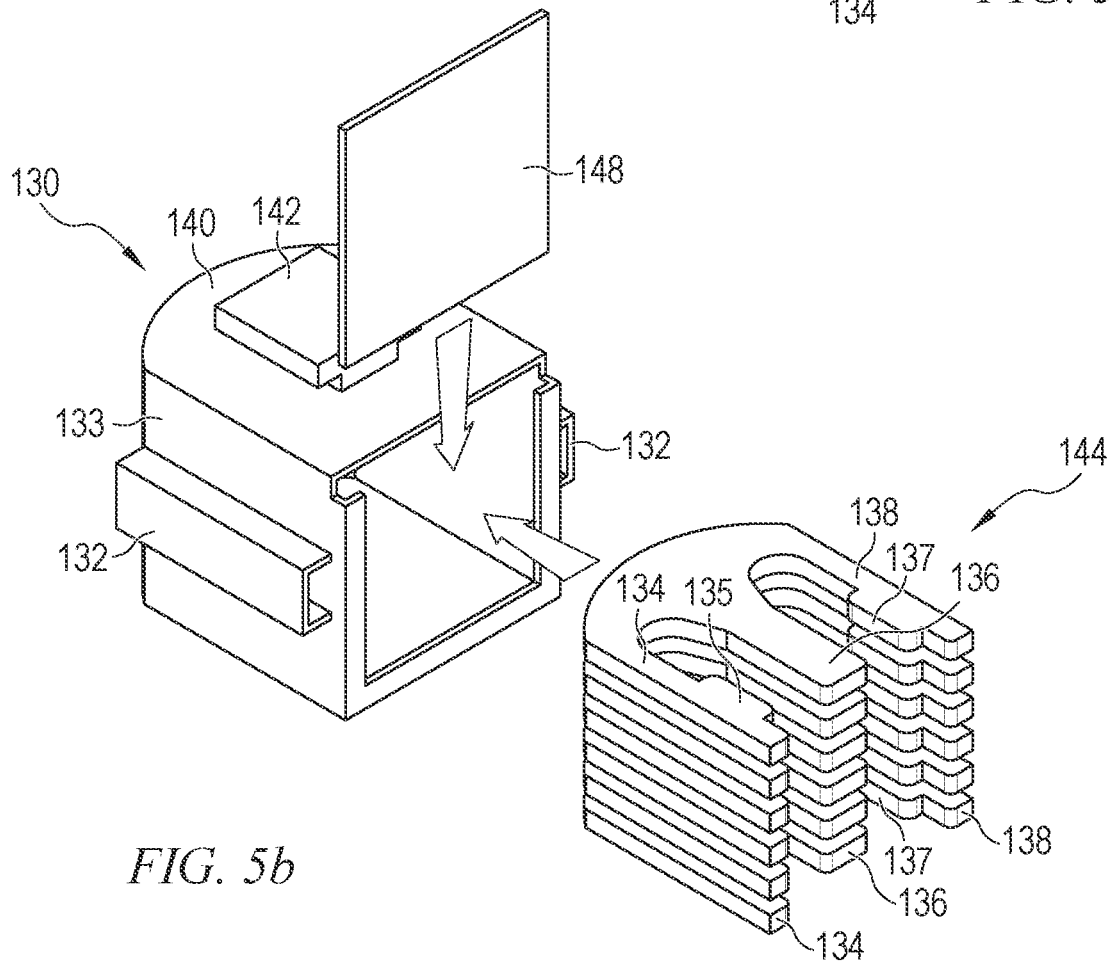

FIG. 5a is a perspective view of another embodiment of FOUP 130 with horizontal support members 134-138 insertable into housing 140. Horizontal support members 134-138 can be inserted individually or collectively as unibody 144. Once unibody 144 is inside housing 140, then FOUP 130 appears similar to FIG. 4c. FIG. 5b is similar to FIG. 5a with slide door 148 with optional slots on top portion for handling to fully or partially cover the front of FOUP 130.

Figure 6A:
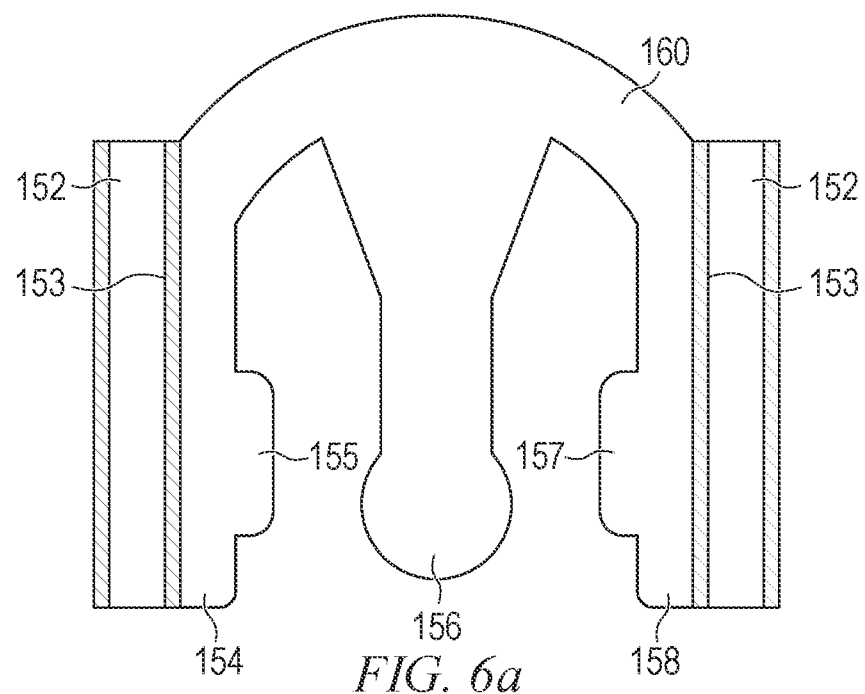
FIGS. 6a-6b illustrate a second embodiment of the FOUP capable of handling a variety of different size and shape semiconductor wafers and panels.
Figure 6B:
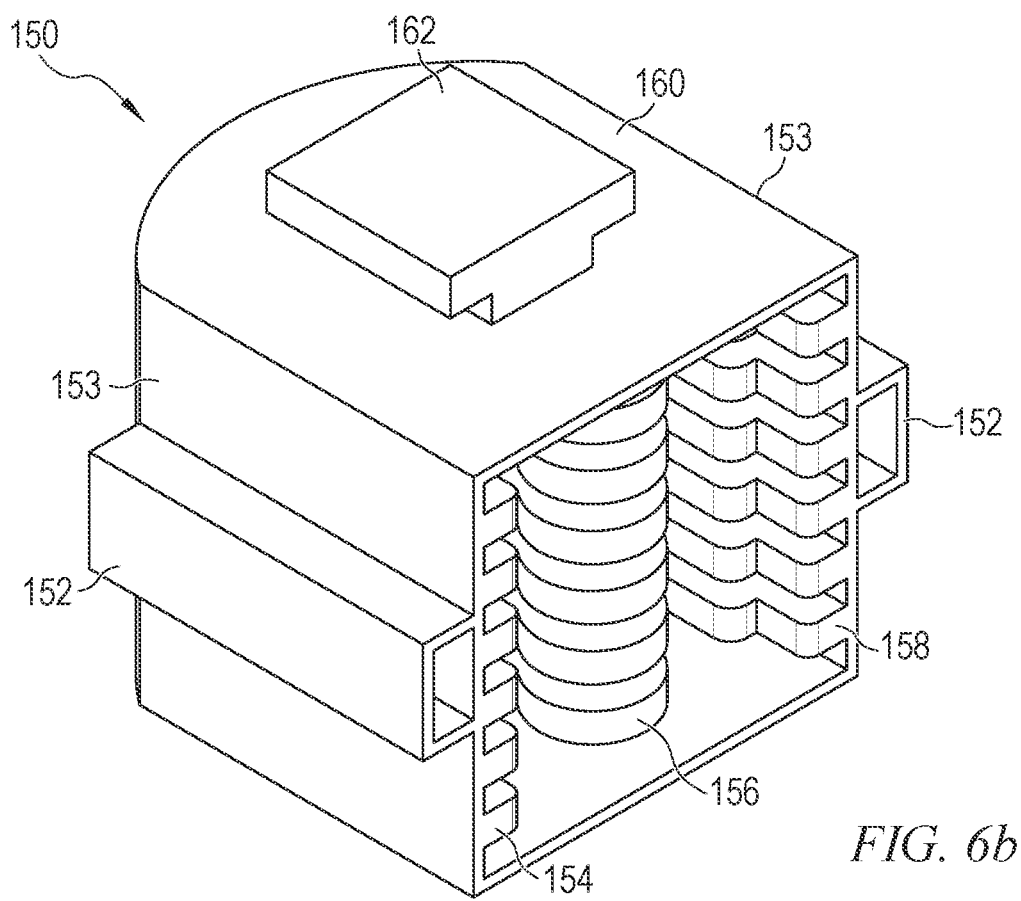

FIG. 6a is a top view of another embodiment of FOUP 150. The front side view of FOUP 150 is similar to FIG. 4b. FOUP 150 is used to simultaneously handle of a variety and mix of semiconductor wafers and/or panels 100, 120, 122, 123, and 124, as well as reconstituted wafer or panel 129, i.e., at least two kinds, for various semiconductor manufacturing operations. FIG. 6b is a perspective view of FOUP 150 with optional slide door as in FIG. 5b. Collectively, FIGS. 6a-6b illustrate how FOUP 150 can simultaneously accommodate and execute manufacturing processes on multiple combinations of wafers 250, i.e., at least two kinds, see FIGS. 11-13. Channels 152 with either full or partial length of FOUP are affixed to or molded with side surface 153 of housing 160. In one embodiment, channel 152 may have slot opening at the bottom for hand carrying. Horizontal support members 154, 156, and 158, also referred to as slot supports or tongues, extend from the back of housing 160 to the front of the housing in a parallel orientation. Wing 155 of side horizontal support member 154 and wing 157 of side horizontal support member 158 provide additional surface area to overlap and support a variety of different size and shape of wafers 250 for various semiconductor manufacturing steps, at the same time. In one embodiment, wafers 250 can overlap wings 155 and 157 by greater than 2.0 mm, e.g., 10.0 mm. In some embodiments, center horizontal support member 156 is shorter than side horizontal support members 154 and 158 to aid with loading and unloading of wafers 250. Handle 162 extending from housing 160 provides a secure way to carry, maneuver, or suspend FOUP 150.

FOUP 150 has a common set of dimensions to accommodate and support wafers 250. One FOUP 150 can accommodate and support multiple combinations of wafers 250. In other words, one set of dimensions for FOUP 150 works for simultaneous processing of a variety of sizes and shapes of wafers 250.

Figure 7A:
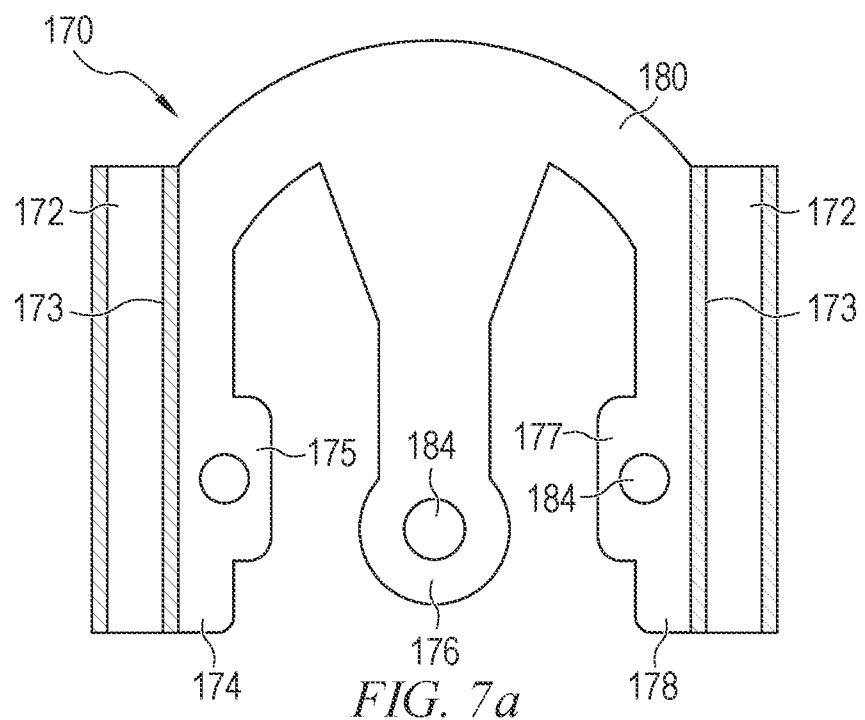
FIGS. 7a-7b illustrate a third embodiment of the FOUP capable of handling a variety of different size and shape semiconductor wafers and panels.
Figure 7B:
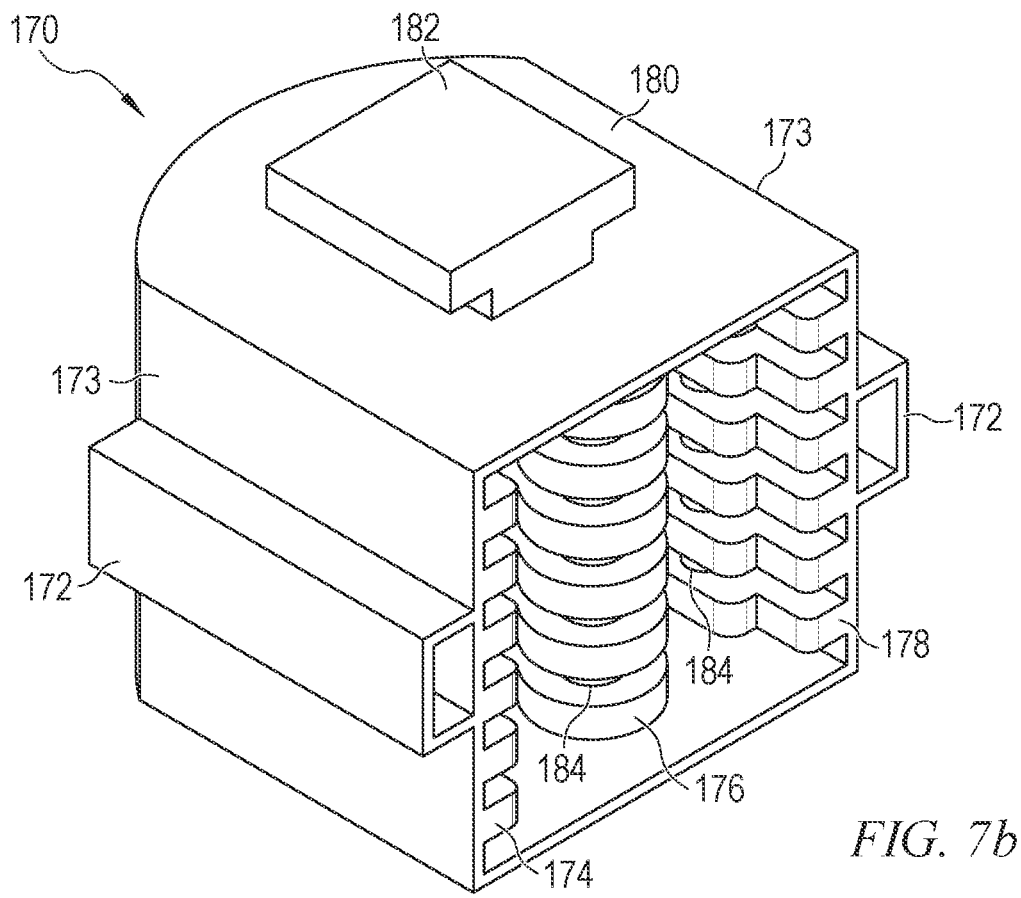

FIG. 7a is a top view of another embodiment of FOUP 170. The front side view of FOUP 170 is similar to FIG. 4b. FOUP 170 is used to simultaneously handle a variety and mix of semiconductor wafers and/or panels 100, 120, 122, 123, and 124, as well as reconstituted wafer 129, i.e., at least two kinds, for various semiconductor manufacturing operations. FIG. 7b is a perspective view of FOUP 170. Collectively, FIGS. 7a-7b illustrate how FOUP 170 can simultaneously accommodate and execute manufacturing processes on multiple combinations of wafers 250, i.e., at least two kinds, see FIGS. 11-13. Channels 172 are affixed to or molded with side surface 173 of housing 180. Horizontal support members 174, 176, and 178, also referred to as slot supports or tongues, extend from the back of housing 180 to the front of the housing in a parallel orientation. Wing 175 of side horizontal support member 174 and wing 177 of side horizontal support member 178 provide additional surface area to accommodate and support different size and shape of wafers 250. Wing 175 of side horizontal support member 174 and wing 177 of side horizontal support member 178 provide additional surface area to overlap and support a variety of wafers 250 for various semiconductor manufacturing steps, at the same time. In one embodiment, wafers 250 can overlap wings 175 and 177 by greater than 2.0 mm, e.g., 10.0 mm. In one embodiment, the center support member 176 extends at least 60% of the housing length. In some embodiments, center horizontal support member 176 is shorter than side horizontal support members 174 and 178 to aid with loading and unloading of wafers 250. Handle 182 extending from housing 180 provides a secure way to carry, maneuver, or suspend FOUP 170. Openings 184 in horizontal support members 174-178 provide access to read the wafer type and size by laser identification, and may help to reduce the weight of FOUP and reduce the stress of support.

FOUP 170 has a common set of dimensions to accommodate and support wafers 250. One FOUP 170 can accommodate and support multiple combinations of wafers 250. In other words, one set of dimensions for FOUP 170 works for simultaneous processing of a variety of sizes and shapes of wafers 250.

Figure 8A:
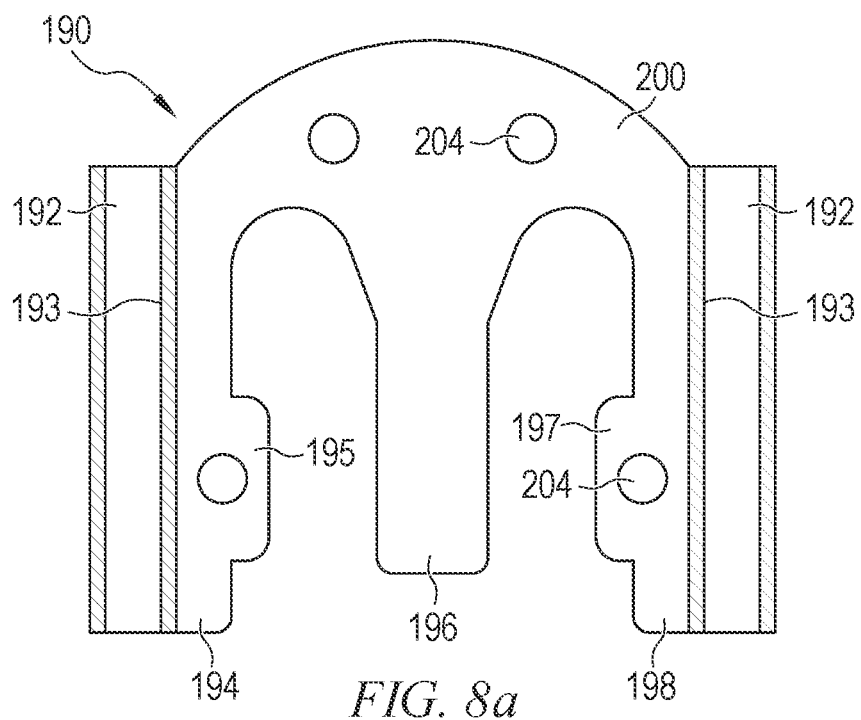
FIGS. 8a-8b illustrate a fourth embodiment of the FOUP capable of handling a variety of different size and shape semiconductor wafers and panels.
Figure 8B:
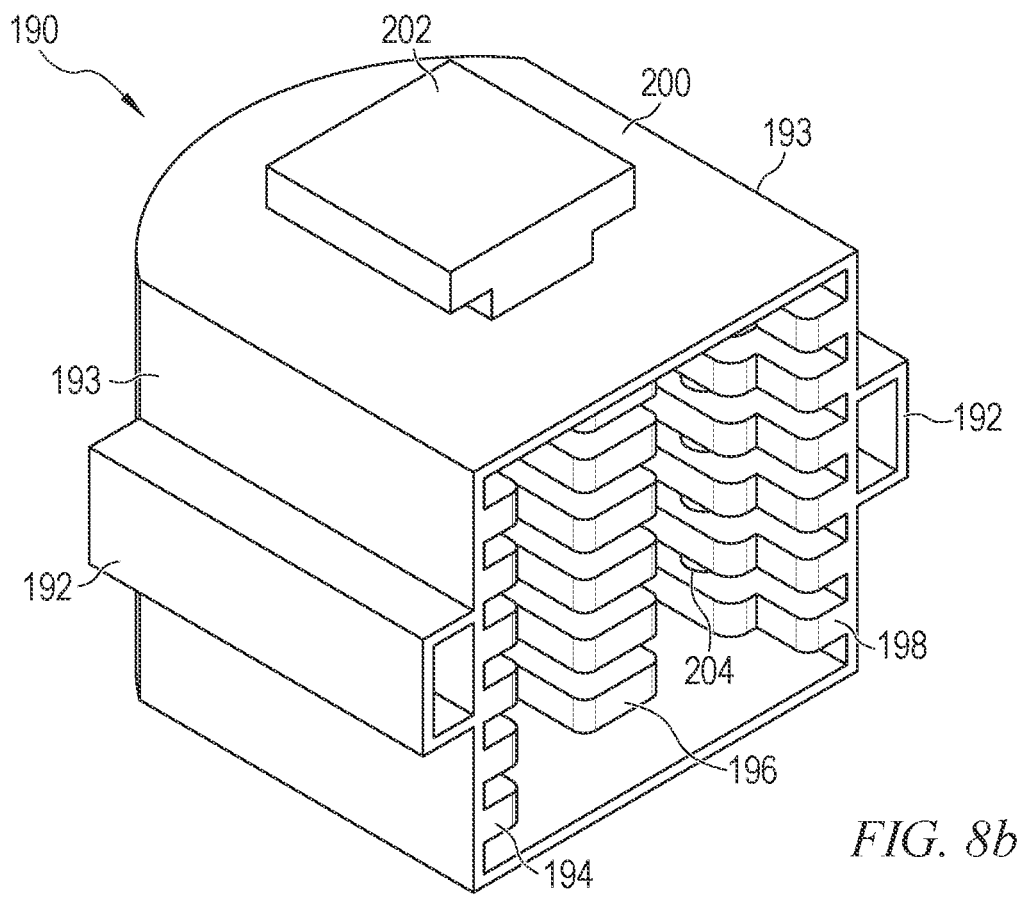

FIG. 8a is a top view of another embodiment of FOUP 190. The front side view of FOUP 190 is similar to FIG. 4b. FOUP 190 is used to simultaneously handle a variety and mix of semiconductor wafers and/or panels 100, 120, 122, 123, and 124, as well as reconstituted wafer or panel 129, i.e., at least two kinds, for various semiconductor manufacturing operations. FIG. 8b is a perspective view of FOUP 190. Collectively, FIGS. 8a-8b illustrate how FOUP 190 can simultaneously accommodate and execute manufacturing processes on multiple combinations of wafers 250, i.e., at least two kinds, see FIGS. 11-13. Channels 192 with either full or partial length of FOUP are affixed to or molded with side surface 193 of housing 200. Horizontal support members 194, 196, and 198, also referred to as slot supports or tongues, extend from the back of housing 200 to the front of the housing in a parallel orientation. Wing 195 of side horizontal support member 194 and wing 197 of side horizontal support member 198 provide additional surface area to overlap and support a variety of different size and shape of wafers 250 for various semiconductor manufacturing steps, at the same time. In one embodiment, wafers 250 can overlap wings 195 and 197 by greater than 2.0 mm, e.g., 10.0 mm. In one embodiment, the center support member 196 extends at least 60% of the housing length. In some embodiments, center horizontal support member 196 is shorter than side horizontal support members 194 and 198 to aid with loading and unloading of wafers 250. Handle 202 extending from housing 200 provides a secure way to carry, maneuver, or suspend FOUP 190. Openings 204 in horizontal support members 194-198 provide access to read the wafer type and size by laser identification, and may also help to reduce the weight of FOUP and stress of supports.

FOUP 190 has a common set of dimensions to accommodate and support wafers 250. One FOUP 190 can accommodate and support multiple combinations of wafers 250. In other words, one set of dimensions for FOUP 190 works for simultaneous processing of a variety of sizes and shapes of wafers 250.

Figure 9A:
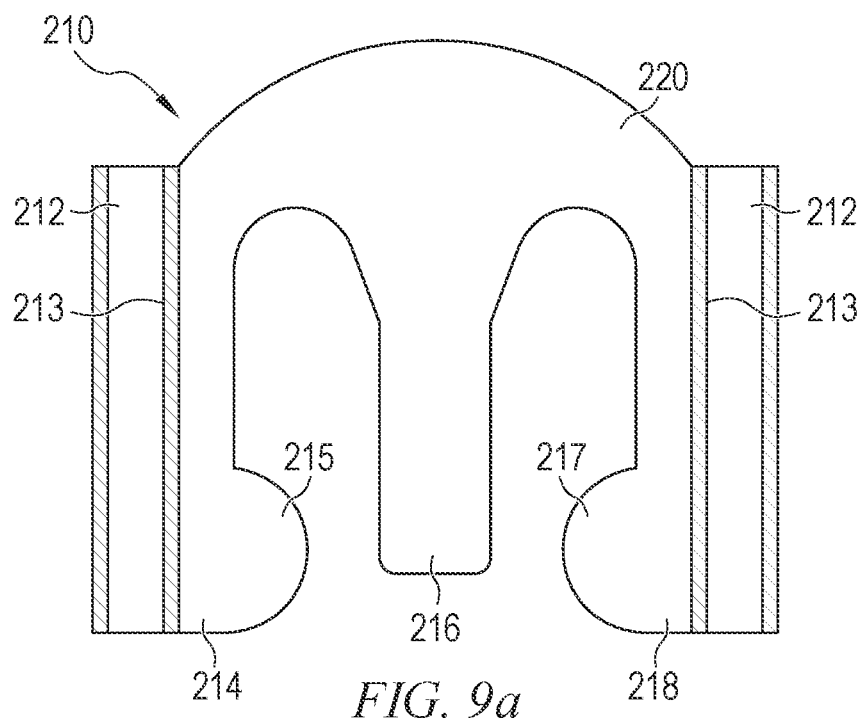
FIGS. 9a-9b illustrate a fifth embodiment of the FOUP capable of handling a variety of different size and shape semiconductor wafers and panels.
Figure 9B:
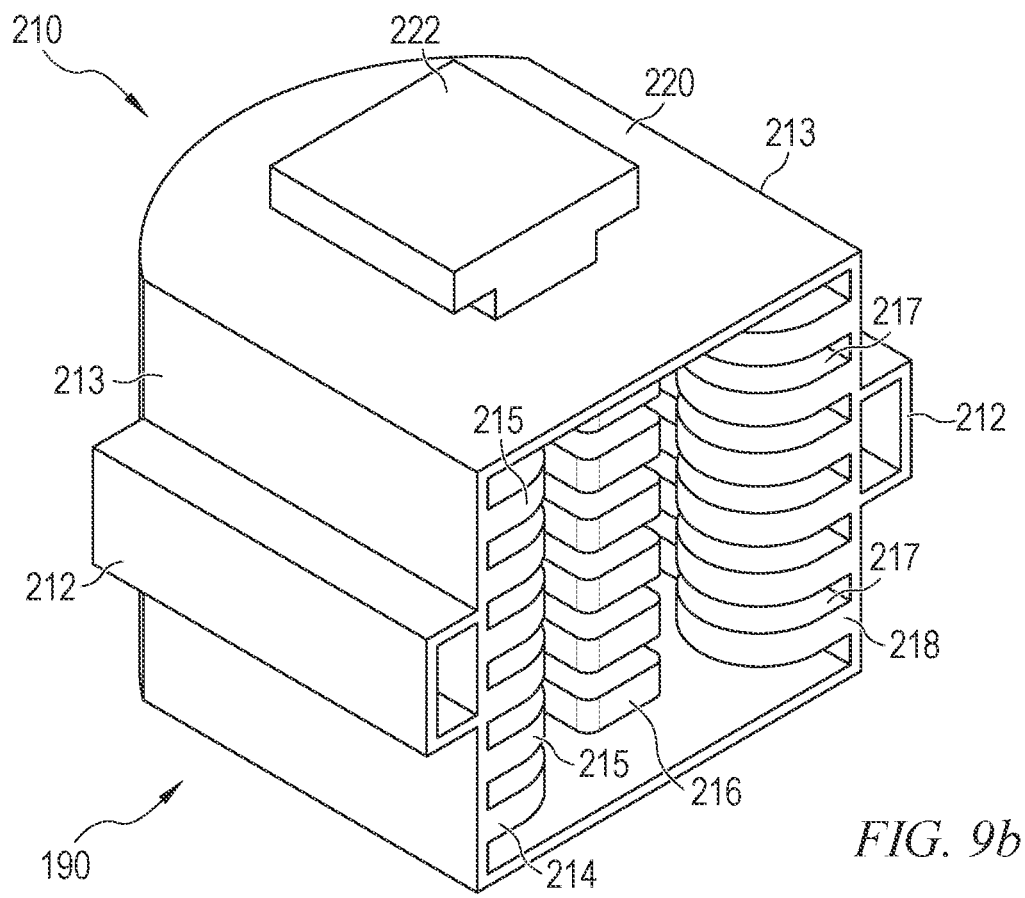

FIG. 9a is a top view of another embodiment of FOUP 210. The front side view of FOUP 210 is similar to FIG. 4b. FOUP 210 is used to simultaneously handle a variety and mix of semiconductor wafers and/or panels 100, 120, 122, 123, and 124, as well as reconstituted wafer or panel 129, i.e., at least two kinds, for various semiconductor manufacturing operations. FIG. 9b is a perspective view of FOUP 210. Collectively, FIGS. 9a-9b illustrate how FOUP 210 can simultaneously accommodate and execute manufacturing processes on multiple combinations of wafers 250, see FIGS. 11-13. Channels 212 with full or partial length of FOUP are affixed to or molded with side surface 213 of housing 220. In one embodiment, channel 212 with partial length of FOUP and locate at about center of FOUP sides has slot opening for hand carrying. Horizontal support members 214, 216, and 218, also referred to as slot supports or tongues, extend from the back of housing 220 to the front of the housing in a parallel orientation. Wing 215 of side horizontal support member 214 and wing 217 of side horizontal support member 218 provide additional surface area to overlap and support a variety of different size and shape of wafers 250 for various semiconductor manufacturing steps, at the same time. In one embodiment, wafers 250 can overlap wings 215 and 217 by greater than 2.0 mm, e.g., 10.0 mm. In one embodiment, the center support member 216 extends at least 60% of the housing length. In some embodiments, center horizontal support member 216 is shorter than side horizontal support members 214 and 218 to aid with loading and unloading of wafers 250. Handle 222 extending from housing 220 provides a secure way to carry, maneuver, or suspend FOUP 210.

FOUP 210 has a common set of dimensions to accommodate and support wafers 250. One FOUP 210 can accommodate and support multiple combinations of wafers 250. In other words, one set of dimensions for FOUP 210 works for simultaneous processing of a variety of sizes and shapes of wafers 250.

Figure 10A:
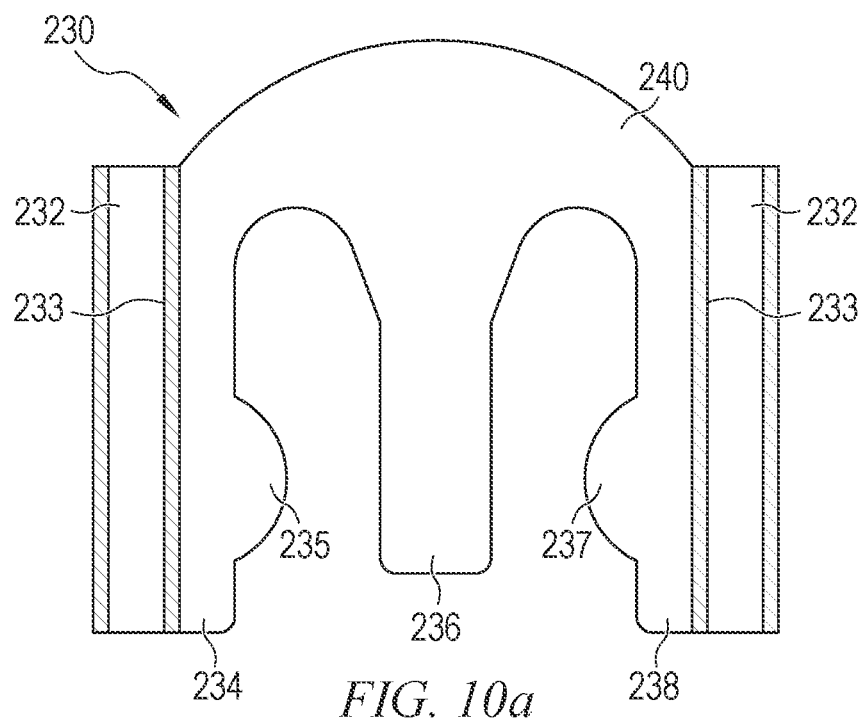
FIGS. 10a-10b illustrate a sixth embodiment of the FOUP capable of handling a variety of different size and shape semiconductor wafers and panels.
Figure 10B:
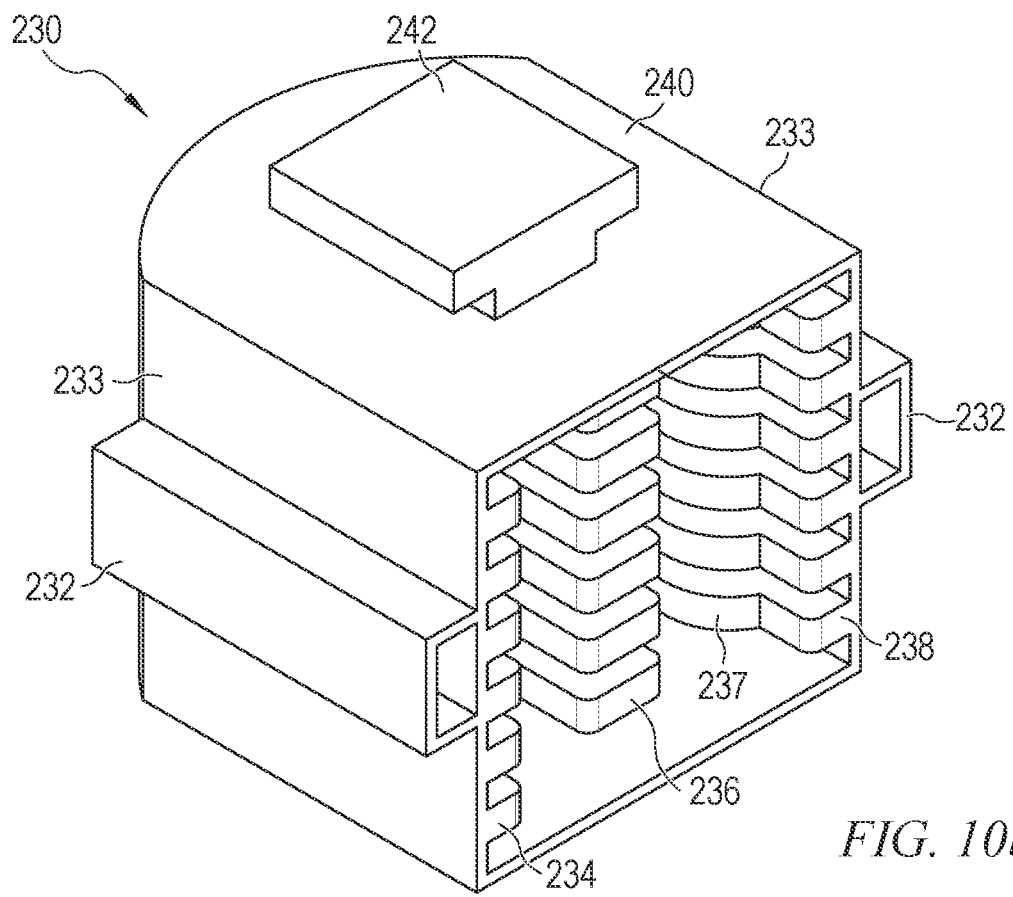

FIG. 10a is a top view of another embodiment of FOUP 230. The front side view of FOUP 230 is similar to FIG. 4b. FOUP 230 is used to simultaneously handle a variety and mix of semiconductor wafers and/or panels 100, 120, 122, 123, and 124, as well as reconstituted wafer or panel 129 for various semiconductor manufacturing operations. FIG. 10b is a perspective view of FOUP 230. Collectively, FIGS. 10a-10b illustrate how FOUP 230 can simultaneously accommodate and execute manufacturing processes on multiple combinations of wafers 250, see FIGS. 11-13. Channels 232 are affixed to or molded with side surface 233 of housing 240. Horizontal support members 234, 236, and 238, also referred to as slot supports or tongues, extend from the back of housing 240 to the front of the housing in a parallel orientation. Wing 235 of side horizontal support member 234 and wing 237 of side horizontal support member 238 provide additional surface area to overlap and support a variety of different size and shape of wafers 250 for various semiconductor manufacturing steps, at the same time. In one embodiment, wafers 250 can overlap wings 235 and 237 by greater than 2.0 mm, e.g., 10.0 mm. In one embodiment, the center support member 236 extends at least 60% of the housing length. In some embodiments, center horizontal support member 236 is shorter than side horizontal support members 234 and 238 to aid with loading and unloading of wafers 250. Handle 242 extending from housing 240 provides a secure way to carry, maneuver, or suspend FOUP 230.

FOUP 230 has a common set of dimensions to accommodate and support wafers 250. One FOUP 230 can accommodate and support multiple combinations of wafers 250. In other words, one set of dimensions for FOUP 230 works for simultaneous processing of a variety of sizes and shapes of wafers 250, i.e., at least two kinds.

Figure 11A:
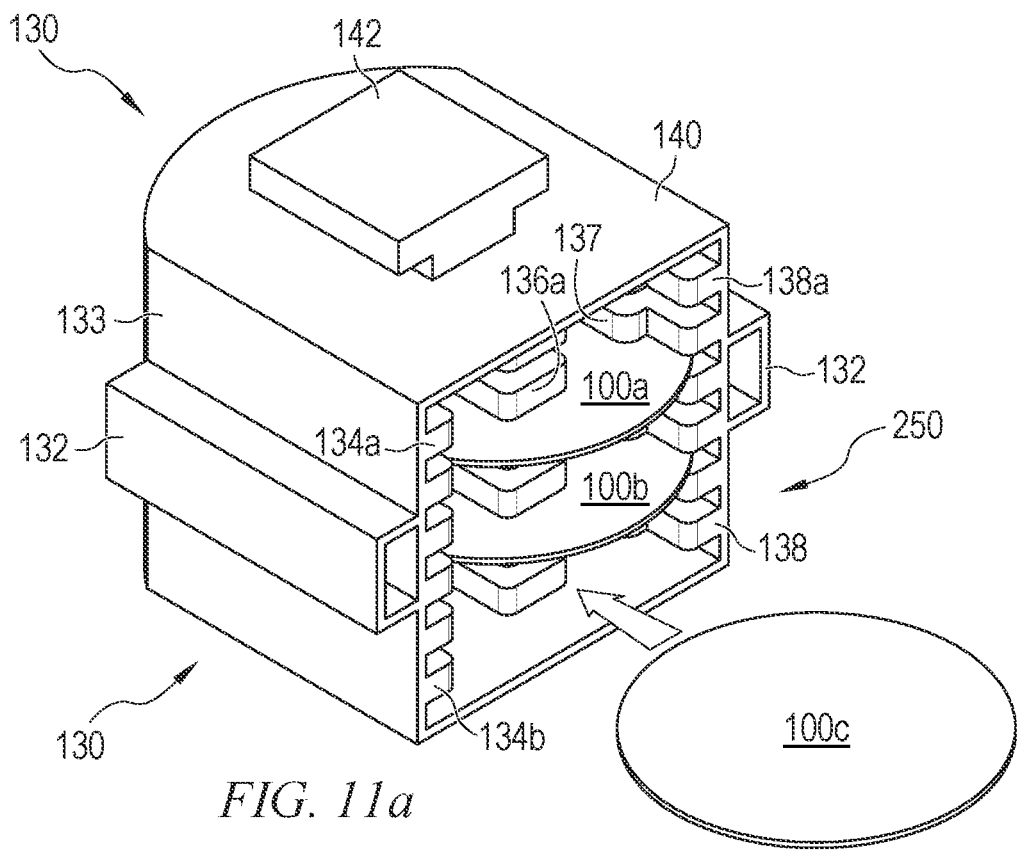
FIGS. 11a-11c illustrate loading a variety of semiconductor wafers and panels into the FOUP for manufacturing processes.
Figure 11B:
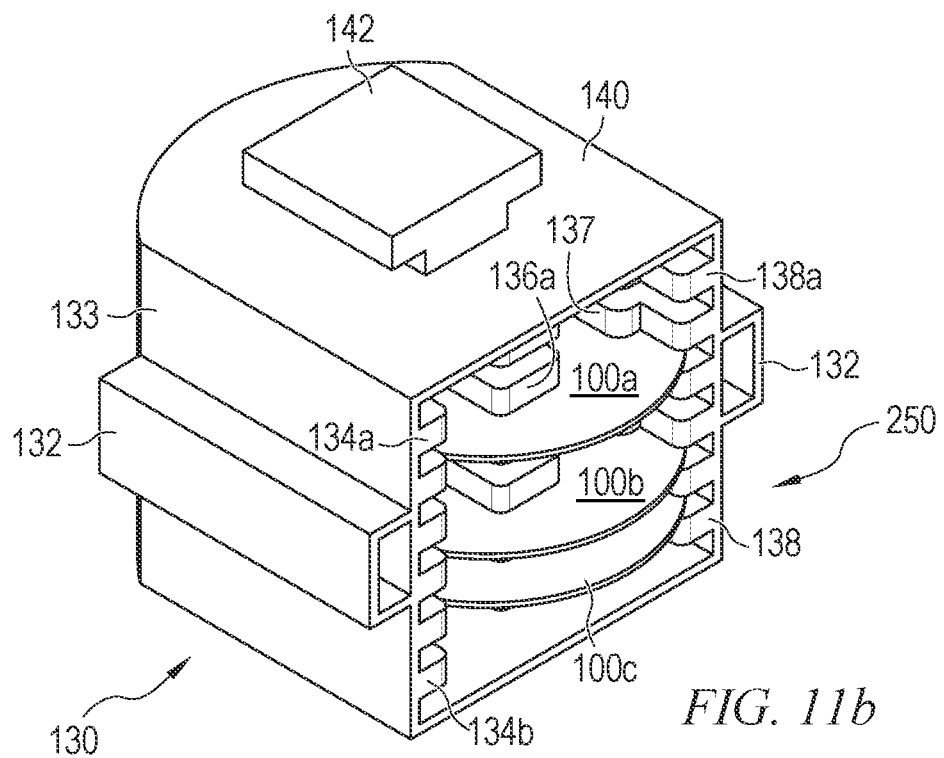
Figure 11C:
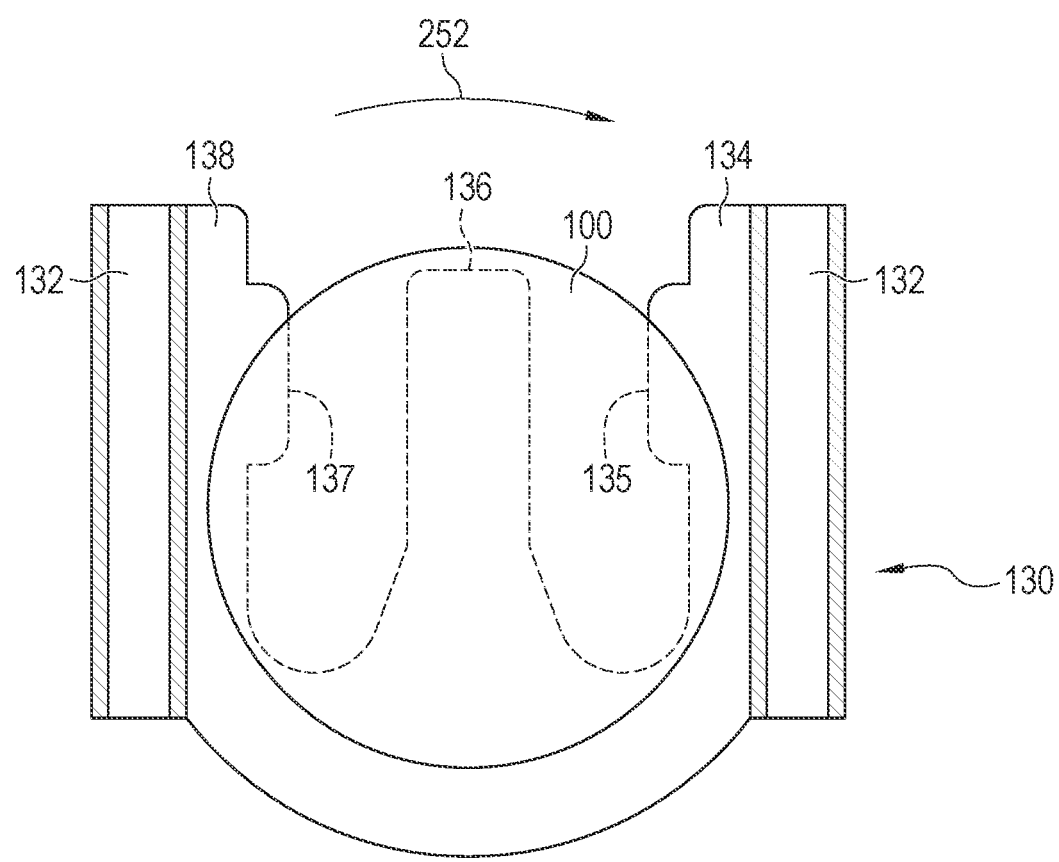

As noted, FOUP 130, 150, 170, 210, and 230 can simultaneously accommodate and support multiple combinations of different sizes and shapes of wafers 250, i.e., at least two kinds, for various semiconductor manufacturing operations. FIG. 11a shows a plurality of circular semiconductor wafers 100a, 100b, and 100c being loaded into FOUP 130. FIG. 11b shows all semiconductor wafers 100a-100c loaded into FOUP 130. FIG. 11c is a top view of semiconductor wafers 100a-100c loaded into FOUP 130. At least a portion of semiconductor wafers 100a-100c are supported by wing 135 of horizontal support member 134 and wing 137 of horizontal support member 138, as well as center horizontal support member 136. Semiconductor wafers 100a-100c can be the same size or different sizes. In one embodiment, semiconductor wafer 100a is 400 mm in diameter, semiconductor wafer 100b is 450 mm in diameter, and semiconductor wafer 100c is 510 mm in diameter. In one embodiment, additional slot support positioner may be installed to accommodate different wafer sizes. Semiconductor wafers 100 can rotate or spin within FOUP 130, all at the same time, in the direction of arrow 252 to perform various processing steps.

Figure 12A:
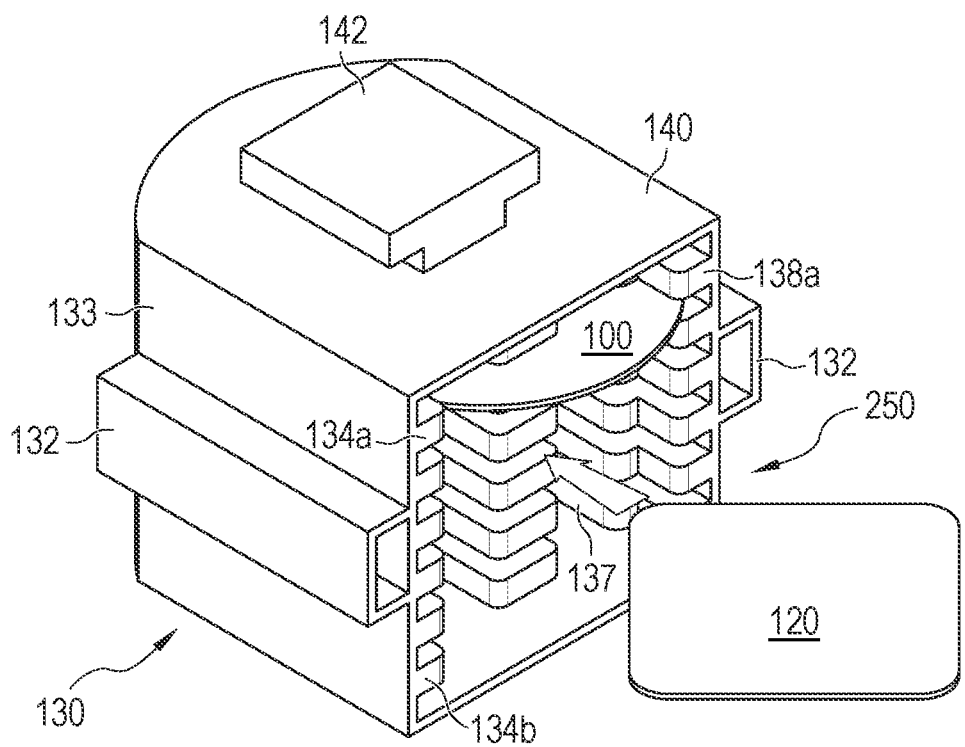
FIGS. 12a-12c illustrate loading a variety of different size and shape semiconductor wafers and panels into the FOUP for manufacturing processes.
Figure 12B:
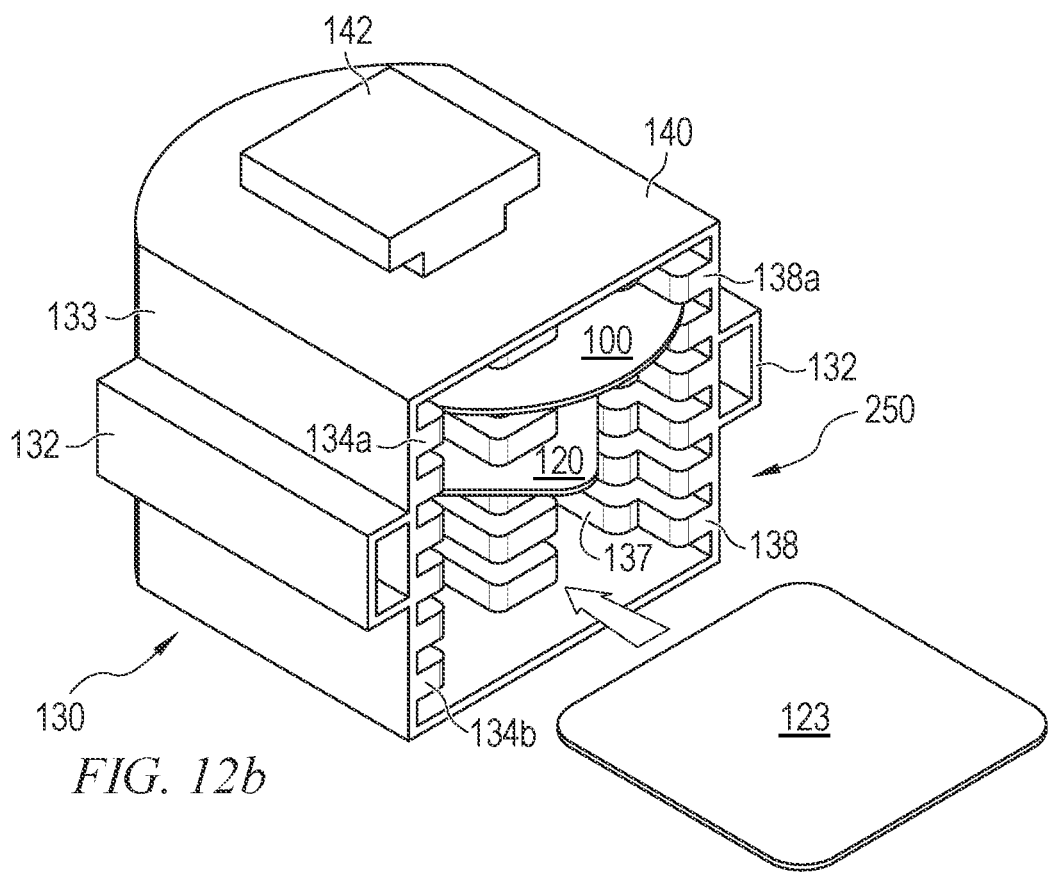
Figure 12C:
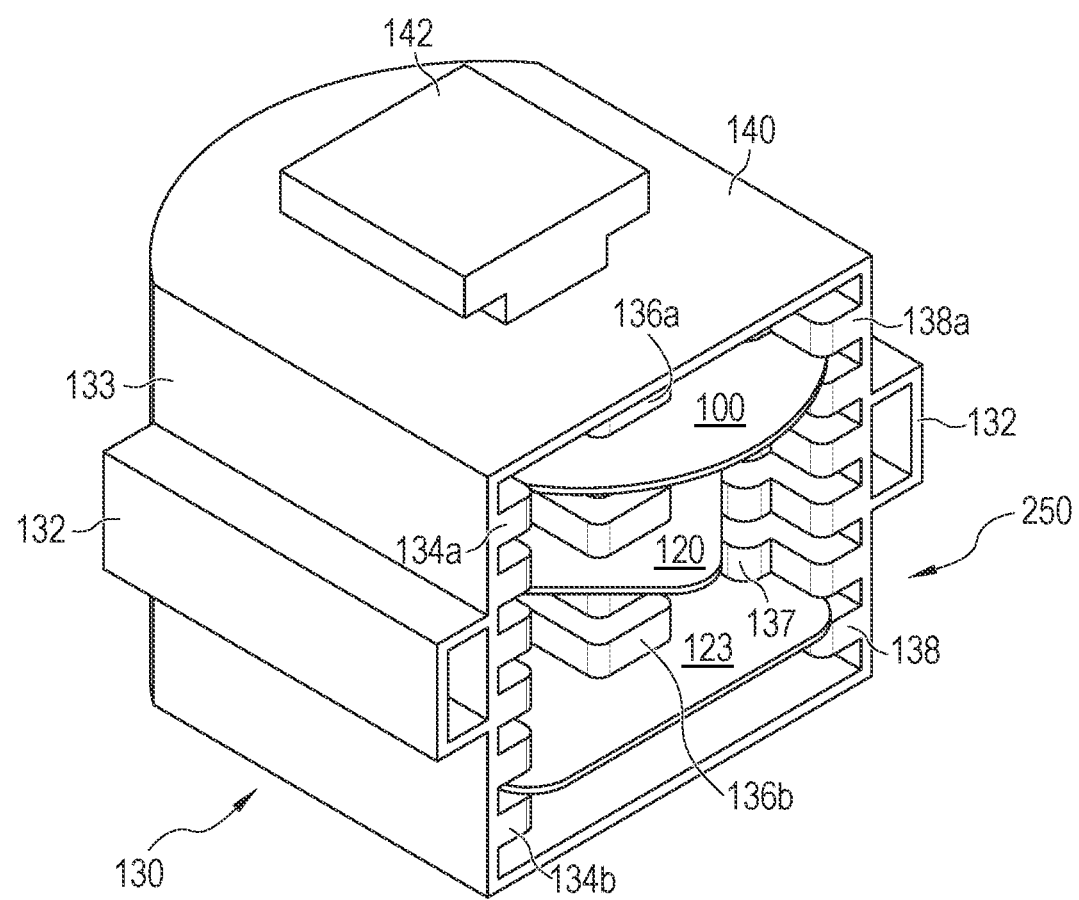

FIGS. 12a and 12b show a plurality of semiconductor wafers 100, 120, and 123 being loaded into FOUP 130. FIG. 12c shows all semiconductor wafers 100, 120, and 123 loaded into FOUP 130. Semiconductor wafers 100, 120, and 123 have different sizes and shapes. In fact, FOUP 130 can handle a variety and mix of semiconductor wafers and/or panels 100, 120, 122, 123, and 124, as well as reconstituted wafer 129, at least two kinds at the same time, see FIGS. 2a-2e and 3a-3b. In one embodiment, semiconductor wafer 100 is 450 mm in diameter, semiconductor wafer 120 is 320×320 mm, and semiconductor wafer 123 is 350×350 mm. In one embodiment, additional slot support positioner may be installed to accommodate different wafer or panel sizes. Semiconductor wafers 250 can rotate or spin within FOUP 130, all at the same time, to perform various processing steps.

Figure 13A:
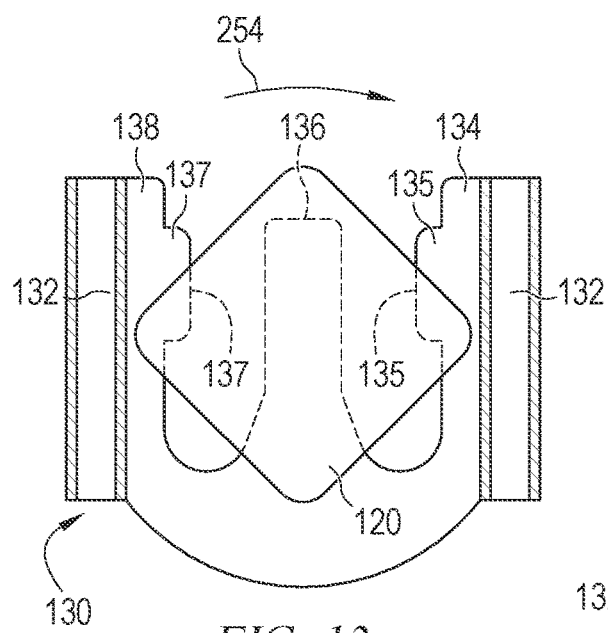
FIGS. 13a-13d illustrate a variety of different size and shape semiconductor wafers and panels loaded into the FOUP.
Figure 13B:
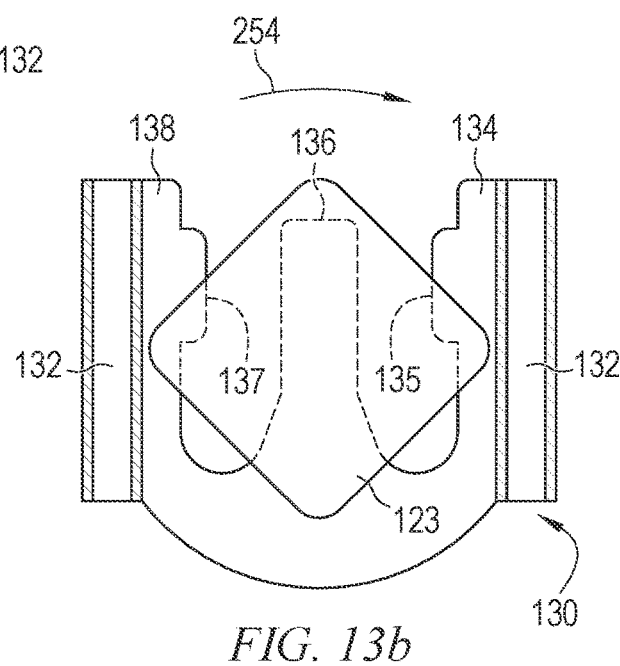
Figure 13C:
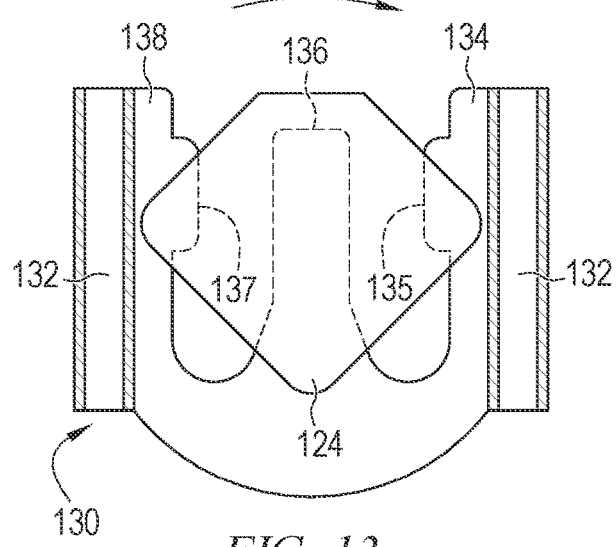
Figure 13D:
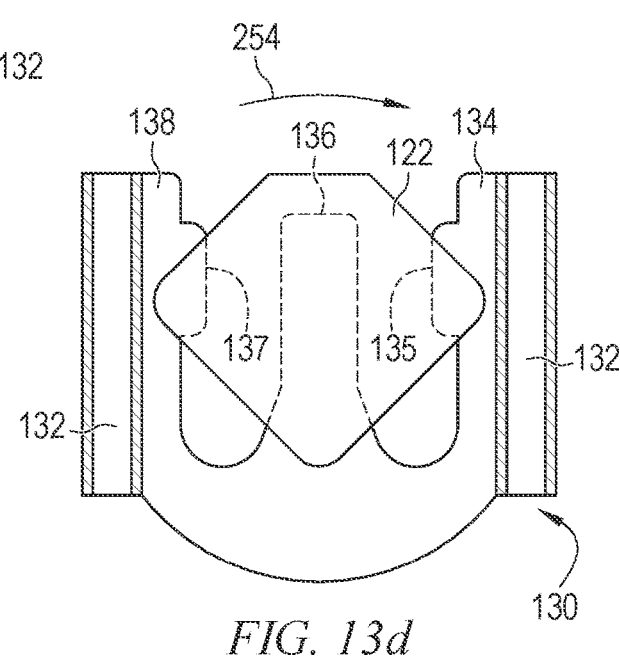

FIG. 13a shows at least a portion of semiconductor wafer 120 being supported by wing 135 of horizontal support member 134 and wing 137 of horizontal support member 138, as well as center horizontal support member 136. FIG. 13b shows at least a portion of semiconductor wafer 123 being supported by wing 135 of horizontal support member 134 and wing 137 of horizontal support member 138, as well as center horizontal support member 136. FIG. 13c shows at least a portion of semiconductor wafer 122 being supported by wing 135 of horizontal support member 134 and wing 137 of horizontal support member 138, as well as center horizontal support member 136. FIG. 13d shows at least a portion of semiconductor wafer 122 being supported by wing 135 of horizontal support member 134 and wing 137 of horizontal support member 138, as well as center horizontal support member 136. In one embodiment, semiconductor wafer 120 is 450×450 mm, semiconductor wafer 120 is 360×360 mm, semiconductor wafer 122 is 320×320 mm, and semiconductor wafer 123 is 510×515 mm. In one embodiment, additional slot support positioner may be installed to accommodate different wafer sizes. Semiconductor wafers 250 and 122 can rotate or spin within FOUP 130, all at the same time, in the direction of arrow 254 to perform various processing steps.

The following discussion uses FOUP 130 as an example and is applicable to FOUP 150, 170, 210, and 230. FOUP 130 provides flexibility on the manufacturing line, in combination with other equipment and tooling, to handle multiple semiconductor wafers or panels 250, as described above. FOUP 130 can handle, at the same time, two or more different sizes and shapes of wafers 250, such as 450 mm circular wafer 100 and 320×320 mm panel 123. FOUP 130 may have an end-effector, such as with vacuum cups, to handle and transfer wafers 250. In particular, FOUP 130 would be useful in various semiconductor manufacturing steps, such as RDL metal and dielectric layer build-up and lithography patterning processes. One application is sub-10 µm RDL and sub-5 µm L/S on a flexible manufacturing line with high yield. Other applications are ball drop, backgrinding, singulation, and laser marking. For example, FOUP 130 can accommodates wafers 250 for processing steps involving spinning or otherwise supporting the wafer, such as spin coating with spin dry and soft bake, film lamination, slit coating, spray and molding process with ultra-violet (UV) light/laser exposure, wet chemical development, spray/stream wet, and laser ablation. FOUP 130 is applicable to chip-to-wafer (C2W), chip-on-substrate (CoS), and surface mount technology (SMT). A significant portion of other manufacturing line equipment can be shared wafers 250. Wafer 250 can focus on legacy spin process and the panel focuses on legacy lamination process, while there may be some hybrid process or materials shared on wafer and panel.

Figure 14A:
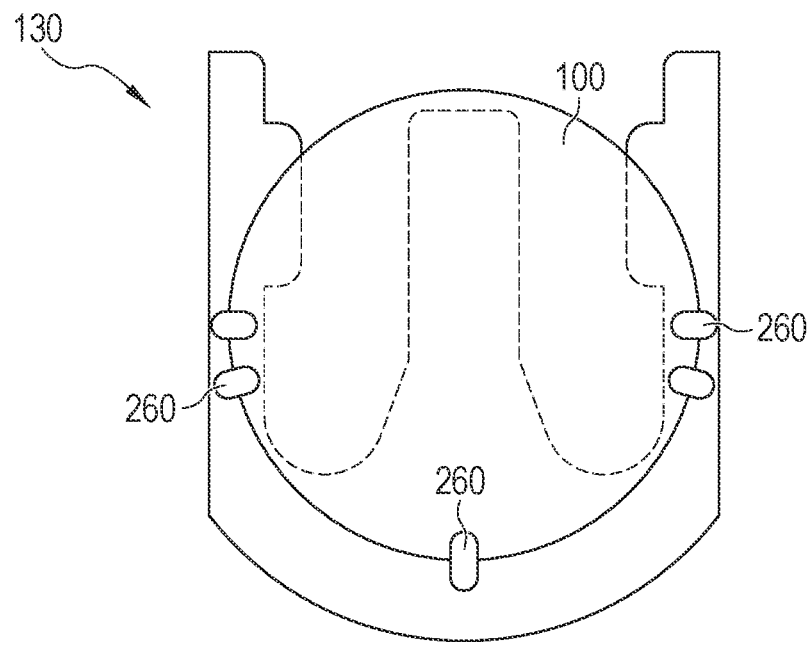
FIGS. 14a-14c illustrate substrate size adjustment slots.
Figure 14B:
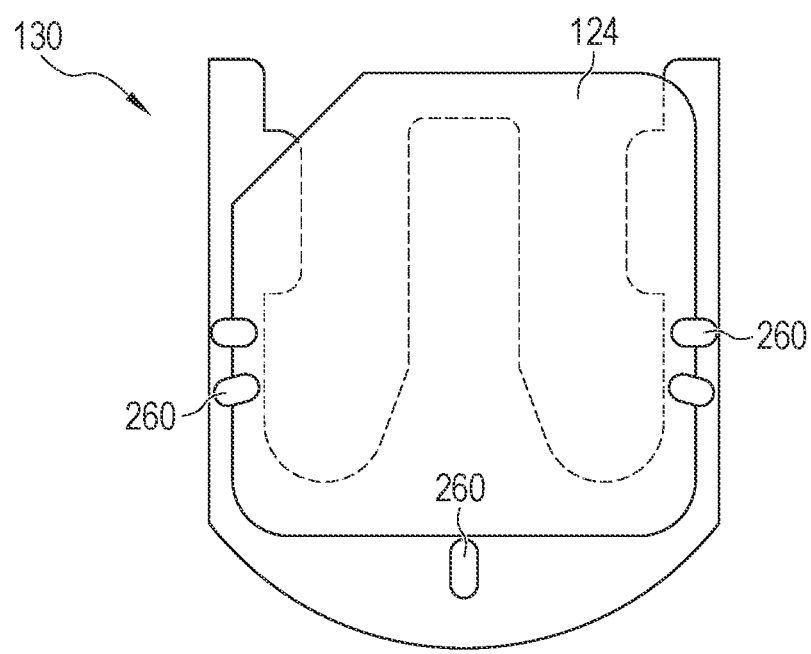
Figure 14C:
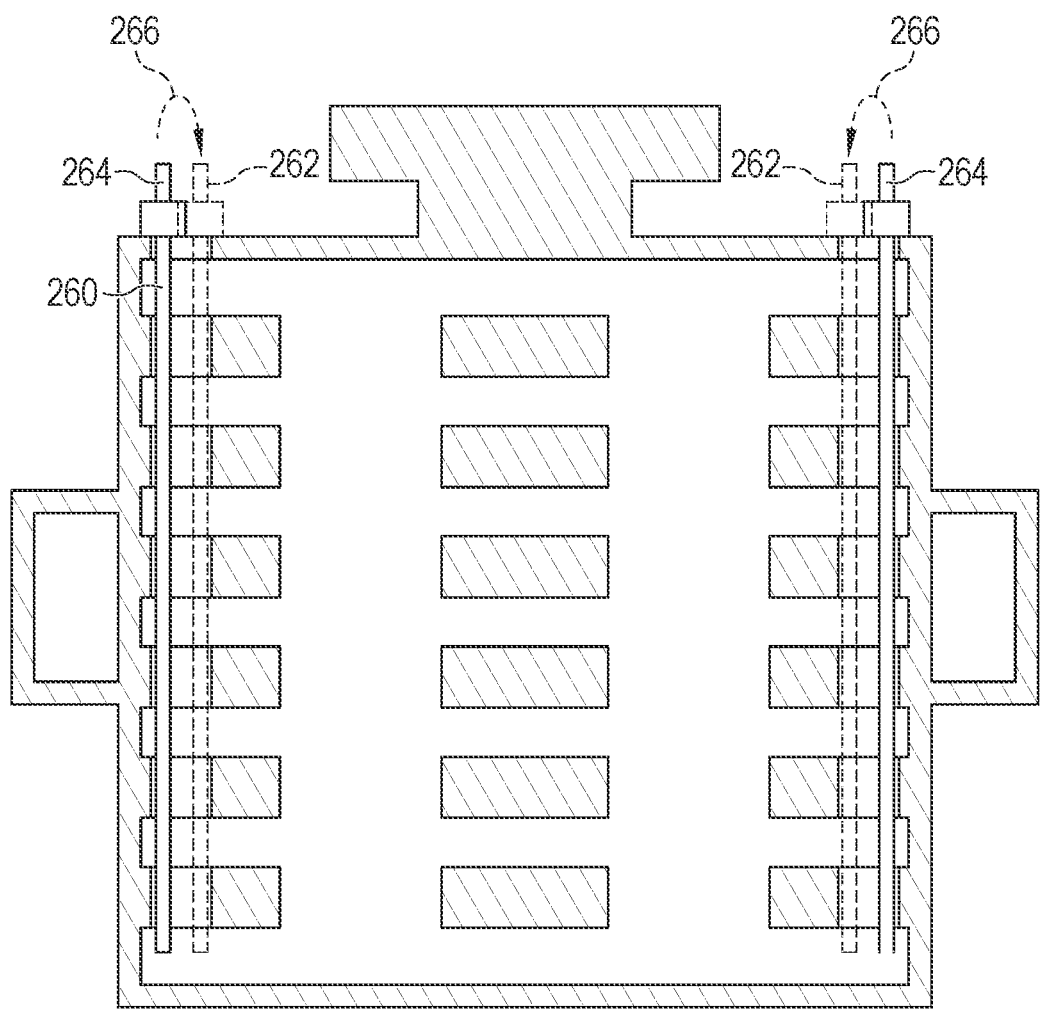

FIG. 14a illustrates a substrate size adjustment slot 260 for accommodating size positioner. FIGS. 14a and 14c show a first position 262 of slot 260 accommodating a 450 mm wafer 100. Slot 260 is rotated in the direction of arrow 266 to a second position. FIGS. 14b and 14c further show a second position 264 of slot 260 accommodating a 510×515 mm panel 124. In another embodiment, position 262 may be placed from the side of slot supports.

Figure 15A:
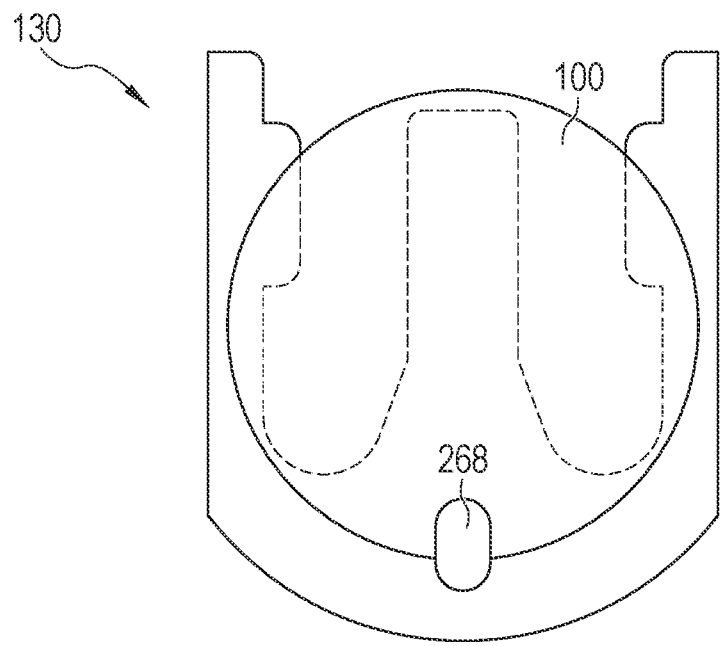
FIGS. 15a-15b illustrate another embodiment of the substrate size adjustment slots.
Figure 15B:
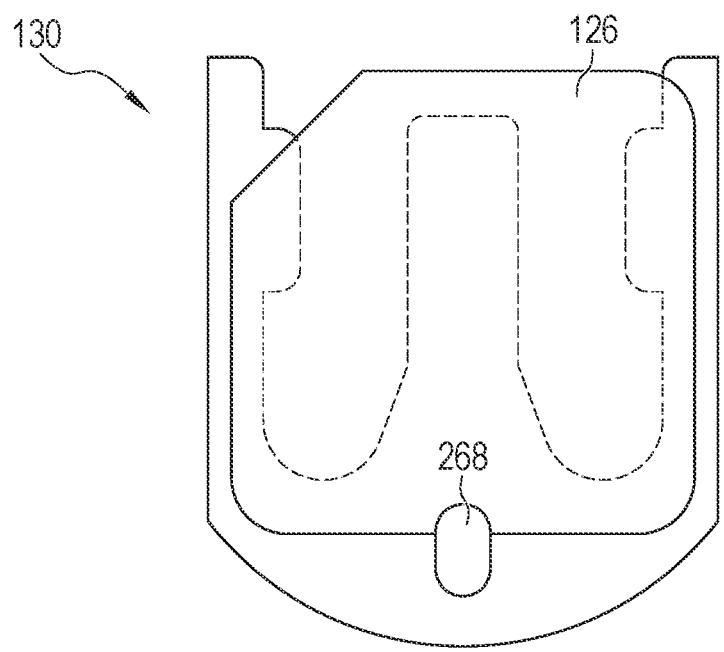

In another embodiment, FIG. 15a illustrates a substrate size adjustment slot 268. FIG. 15a shows a first position 262 of slot 260 accommodating a 450 mm wafer 100. Slot 268 is rotated in the direction to a second position. FIG. 15b further shows a second position of slot 268 accommodating a 400×450 panel 124.

Figure 16:
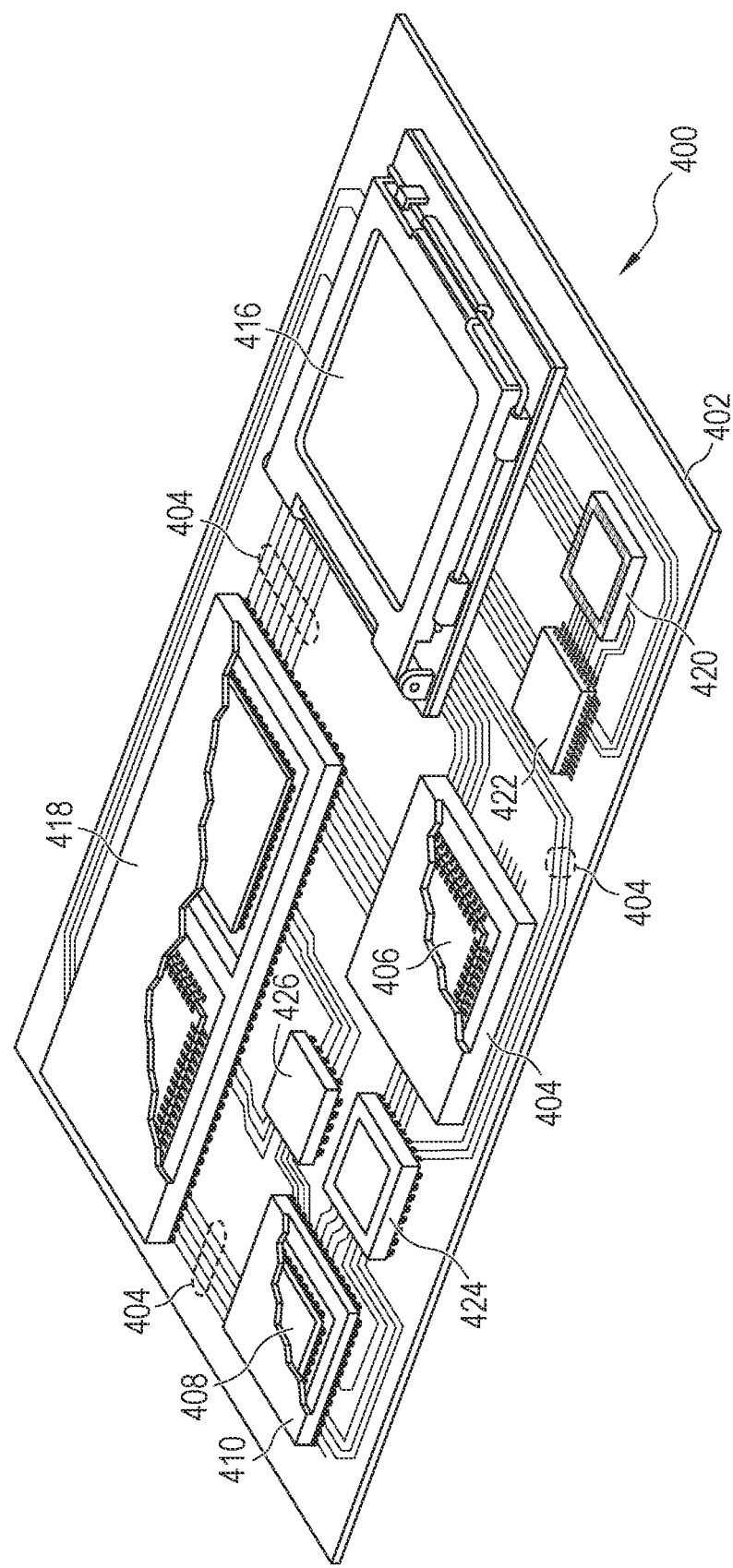
FIG. 16 illustrates a printed circuit board (PCB) with different types of packages disposed on a surface of the PCB.

FIG. 16 illustrates electrical device 400 having a chip carrier substrate or PCB 402 with a plurality of semiconductor packages disposed on a surface of PCB 402, including semiconductor devices from wafers 250. Electrical device 400 can have one type of semiconductor package, or multiple types of semiconductor packages, depending on the application.

Electrical device 400 can be a stand-alone system that uses the semiconductor packages to perform one or more electrical functions. Alternatively, electrical device 400 can be a subcomponent of a larger system. For example, electrical device 400 can be part of a tablet, cellular phone, digital camera, communication system, or other electrical device. Alternatively, electrical device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 16, PCB 402 provides a general substrate for structural support and electrical interconnect of the semiconductor packages disposed on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB. For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown disposed on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electrical components, can be connected to PCB 402. In some embodiments, electrical device 400 includes a single attached semiconductor package, while other embodiments call for multiple interconnected packages. By combining one or more semiconductor packages over a single substrate, manufacturers can incorporate pre-made components into electrical devices and systems. Because the semiconductor packages include sophisticated functionality, electrical devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor manufacturing equipment, comprising:
   a housing; and
   a plurality of horizontal support members disposed within the housing and connected by a rounded back member to form slot supports accommodating a plurality of different size or shape semiconductor wafers or panels, wherein the plurality of horizontal support members includes,
(a) a first side horizontal support member including a first surface with a first linear portion extending from the rounded back member and a first wing portion disposed intermediate along the first surface between the rounded back member and a distal end of the first linear portion, the first wing portion wider than the first linear portion to support the different size or shape semiconductor wafer or panels,
(b) a second side horizontal support member including a second surface with a second linear portion extending from the rounded back member and a second wing portion disposed intermediate along the second surface between the rounded back member and a distal end of the second linear portion, the second wing portion wider than the second linear portion to support the different size or shape semiconductor wafer or panels, and
(c) a center horizontal support member disposed between the first side horizontal support member and the second side horizontal support member and including a third surface extending the entire length of the housing to support the different size or shape semiconductor wafer or panels, wherein a third surface of the center horizontal support member is angled so as to narrow from the rounded back member to a third linear portion and the third linear portion extends to a rounded distal end of the center horizontal support member disposed at least partially between the first wing portion and second wing portion.

2. The semiconductor manufacturing equipment of claim 1, wherein the plurality of horizontal support members is insertable into the housing.

3. The semiconductor manufacturing equipment of claim 1, wherein the plurality of different size or shape semiconductor wafer or panel includes a first wafer with a diameter ranging from 300 mm to 600 mm and a second panel with dimensions ranging from 200 mm to 600 mm on each side.

4. The semiconductor manufacturing equipment of claim 1, wherein a first one of the plurality of horizontal support members includes an opening.

5. A front opening unified pod, comprising:
a housing; and
a plurality of horizontal support members disposed within the housing and connected by a rounded back member to accommodate a plurality of semiconductor wafers or panels, wherein the plurality of horizontal support members includes,
(a) a first side horizontal support member including a first surface with a first linear portion extending from the rounded back member,
(b) a second side horizontal support member including a second surface with a second linear portion extending from the rounded back member, and
(c) a center horizontal support member disposed between the first side horizontal support member and the second side horizontal support member, wherein a third surface of the center horizontal support member is angled so as to narrow from the rounded back member to a third linear portion and the third linear portion extends to a rounded distal end of the center horizontal support member.

6. The front opening unified pod of claim 5, wherein the plurality of semiconductor wafers or panels has a different size or shape.

7. The front opening unified pod of claim 6, wherein a first one of the plurality of horizontal support members includes a wing to support the plurality of different size or shape semiconductor wafers or panels.

8. The front opening unified pod of claim 5, wherein the plurality of horizontal support members is insertable into the housing.

9. The front opening unified pod of claim 5, wherein the plurality of different size or shape semiconductor wafer or panel includes a first wafer with a diameter ranging from 300 mm to 600 mm and a second panel with dimensions ranging from 200 mm to 600 mm on each side.

10. The front opening unified pod of claim 5, wherein a first one of the plurality of horizontal support members includes an opening.

11. The semiconductor manufacturing equipment of claim 5, further including a first wing portion disposed intermediate along the first surface between the rounded back member and a distal end of the first linear portion, the first wing portion wider than the first linear portion to support the different size or shape semiconductor wafer or panels.

12. The semiconductor manufacturing equipment of claim 11, further including a second wing portion disposed intermediate along the second surface between the rounded back member and a distal end of the second linear portion, the second wing portion wider than the second linear portion.

13. The semiconductor manufacturing equipment of claim 12, wherein the rounded distal end of the center horizontal support member is disposed at least partially between the first wing portion and second wing portion.

14. The semiconductor manufacturing equipment of claim 5, wherein the third surface of the center horizontal support member includes a linear portion disposed between the angled portion of the third surface proximate to the rounded back member and the rounded distal end of the center horizontal support member.

15. A front opening unified pod, comprising:
a housing; and
a plurality of horizontal support members disposed within the housing and connected by a rounded back member to accommodate a plurality of semiconductor wafers or panels, wherein a first one of the plurality of semiconductor wafers is a different size or shape as a second one of the plurality of semiconductor wafers and the plurality of horizontal support members includes,
(a) a first side horizontal support member including a first surface extending from the rounded back member and a first wing portion disposed intermediate along the first surface between the rounded back member and a distal end of the first side horizontal support member, the first wing portion wider than a portion of the first surface proximate to the rounded back member,
(b) a second side horizontal support member including a second surface extending from the rounded back member and a second wing portion disposed intermediate along the second surface between the rounded back member and a distal end of the second side horizontal support member, the second wing portion wider than a portion of the second surface proximate to the rounded back member and, and
(c) a center horizontal support member disposed between the first side horizontal support member and the second side horizontal support member, wherein a third surface of the center horizontal support member proximate to the rounded back member is wider than a rounded distal end of the center horizontal support member disposed at least partially between the first wing portion and second wing portion.

16. The front opening unified pod of claim 15, wherein the plurality of horizontal support members is insertable into the housing.

17. The front opening unified pod of claim 15, wherein the plurality of different size or shape semiconductor wafer or panel includes a first wafer with a diameter ranging from 300 mm to 600 mm and a second panel with dimensions ranging from 200 mm to 600 mm on each side.

18. The front opening unified pod of claim 15, wherein a first one of the plurality of horizontal support members includes an opening.

19. The semiconductor manufacturing equipment of claim 15, wherein the third surface of the center horizontal support member includes a linear portion disposed between the portion of the third surface proximate to the rounded back member and the rounded distal end of the center horizontal support member.

20. A method of making a front opening unified pod, comprising:
providing a housing; and
disposing a plurality of horizontal support members within the housing and connected by a rounded back member and adapted to accommodate a plurality of semiconductor wafers or panels, wherein the plurality of horizontal support members includes,
(a) a first side horizontal support member including a first surface with a first linear portion extending from the rounded back member,
(b) a second side horizontal support member including a second surface with a second linear portion extending from the rounded back member, and
(c) a center horizontal support member disposed between the first side horizontal support member and the second side horizontal support member, wherein a third surface of the center horizontal support member is angled so as to narrow from the rounded back member to a third linear portion and the third linear portion extends to a rounded distal end of the center horizontal support member and including a third surface.

21. The method of claim 20, wherein the plurality of semiconductor wafers or panels has a different size or shape.

22. The method of claim 21, wherein a first one of the plurality of horizontal support members includes a wing to support the plurality of different size or shape semiconductor wafers or panels.

23. The method of claim 20, wherein a first one of the plurality of horizontal support members includes an opening.

24. A method of making a semiconductor manufacturing equipment, comprising:
providing a housing; and
disposing a plurality of horizontal support members connected by a rounded back member within the housing to form slot supports adapted to accommodate a plurality of different size or shape semiconductor wafers or panels, wherein the plurality of horizontal support members includes,
(a) a first side horizontal support member including a first surface with a first linear portion extending from the rounded back member and a first wing portion of the first surface wider than the first linear portion disposed intermediate to the first linear portion between the rounded back member and a distal end of the first linear portion to support the different size or shape semiconductor wafer or panels,
(b) a second side horizontal support member including a second surface with a second linear portion extending from the rounded back member and a second wing portion of the second surface wider than the second linear portion disposed intermediate to the second linear portion between the rounded back member and a distal end of the second linear portion to support the different size or shape semiconductor wafer or panels, and
(c) a center horizontal support member disposed between the first side horizontal support member and the second side horizontal support member and including a third surface to support the different size or shape semiconductor wafer or panels, wherein a third surface of the center horizontal support member is angled so as to narrow from the rounded back member to a third linear portion and the third linear portion extends to a rounded distal end of the center horizontal support member disposed at least partially between the first wing portion and second wing portion.

25. The method of claim 24, wherein the plurality of different size or shape semiconductor wafer or panel includes a first wafer with a diameter ranging from 300 mm to 600 mm and a second panel with dimensions ranging from 200 mm to 600 mm on each side.

26. The method of claim 24, wherein a first one of the plurality of horizontal support members includes an opening.

* * * * *